United States Patent
Okamoto et al.

(10) Patent No.: US 8,772,785 B2
(45) Date of Patent: Jul. 8, 2014

(54) SEMICONDUCTOR DEVICE, SCHOTTKY BARRIER DIODE, ELECTRONIC APPARATUS, AND METHOD OF PRODUCING SEMICONDUCTOR DEVICE

(75) Inventors: Yasuhiro Okamoto, Tokyo (JP); Hironobu Miyamoto, Tokyo (JP); Yuji Ando, Tokyo (JP); Tatsuo Nakayama, Tokyo (JP); Takashi Inoue, Tokyo (JP); Kazuki Ota, Tokyo (JP); Kazuomi Endo, Tokyo (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 297 days.

(21) Appl. No.: 13/141,448

(22) PCT Filed: Nov. 26, 2009

(86) PCT No.: PCT/JP2009/069988
§ 371 (c)(1),
(2), (4) Date: Aug. 24, 2011

(87) PCT Pub. No.: WO2010/073871
PCT Pub. Date: Jul. 1, 2010

(65) Prior Publication Data
US 2011/0297954 A1 Dec. 8, 2011

(30) Foreign Application Priority Data
Dec. 26, 2008 (JP) ................. 2008-335190

(51) Int. Cl.
*H01L 29/15* (2006.01)

(52) U.S. Cl.
USPC .......................................................... 257/76

(58) Field of Classification Search
USPC ................... 257/9–23, 76, 96, 97, 101, 103
See application file for complete search history.

(56) References Cited

U.S. PATENT DOCUMENTS

| 6,996,150 B1* | 2/2006 | Shakuda .................... 372/46.01 |
| 7,063,997 B2* | 6/2006 | Cho et al. ........................ 438/39 |

(Continued)

FOREIGN PATENT DOCUMENTS

| JP | 10-51012 A | 2/1998 |
| JP | 2000208813 A | 7/2000 |

(Continued)

OTHER PUBLICATIONS

International Search Report for PCT/JP2009/069988 mailed Apr. 27, 2010.

(Continued)

*Primary Examiner* — Brook Kebede
(74) *Attorney, Agent, or Firm* — McGinn IP Law Group, PLLC

(57) ABSTRACT

A semiconductor device includes semiconductor layers, an anode electrode, and a cathode electrode. The semiconductor layers include a composition change layer, the anode electrode is electrically connected to one of principal surfaces of the composition change layer through a formation of a Schottky junction between the anode electrode and a part of the semiconductor layers, the cathode electrode is electrically connected to the other of the principal surfaces of the composition change layer through a formation of a junction between the cathode electrode and another part of the semiconductor layers, the anode electrode and the cathode electrode are capable of applying a voltage to the composition change layer in a direction perpendicular to the principal surface.

35 Claims, 19 Drawing Sheets

(56) References Cited

U.S. PATENT DOCUMENTS

| | | | |
|---|---|---|---|
| 7,176,479 B2 * | 2/2007 | Ohba | 257/12 |
| 7,345,297 B2 * | 3/2008 | Yamazoe et al. | 257/12 |
| 8,017,977 B2 | 9/2011 | Twynam | |
| 8,198,652 B2 | 6/2012 | Ando et al. | |
| 8,466,495 B2 | 6/2013 | Ando et al. | |
| 2005/0284518 A1 * | 12/2005 | Yamada et al. | 136/262 |

FOREIGN PATENT DOCUMENTS

| | | |
|---|---|---|
| JP | 2002050773 A | 2/2002 |
| JP | 2004311921 A | 11/2004 |
| JP | 2005532698 A | 10/2005 |
| JP | 2006156467 A | 6/2006 |
| JP | 2007134517 A | 5/2007 |
| JP | 2008-124373 A | 5/2008 |
| WO | WO 2007/122800 (A1) | 11/2007 |

OTHER PUBLICATIONS

S. M. Sze, "Physics of Semiconductor Devices", Second Edition, John Wiley & Sons, 1981, p. 248.

O. Ambacher et al, "Pyroelectric properties of Al(In)GaN/GaN hetero- and quantum well structures", Journal of Physics: Condensed Matter, vol. 14, 2002, pp. 3399-3434.

Notice of Reason(s) for Rejection dated Jul. 3, 2013, with partial English translation.

* cited by examiner

SEMICONDUCTOR DEVICE, SCHOTTKY BARRIER DIODE, ELECTRONIC APPARATUS, AND METHOD OF PRODUCING SEMICONDUCTOR DEVICE

TECHNICAL FIELD

The present invention is related to a semiconductor device, a Schottky barrier diode, an electronic apparatus, and a method of producing a semiconductor device.

BACKGROUND ART

A pressure resistance property and an on-state resistance are important indicators of performance of a rectifier element such as a diode. As a rectifier element that can achieve a high pressure resistance and a low on-state resistance, attention is being given to a Schottky barrier diode (SBD) that uses a III-nitride compound semiconductor having a wide band gap. An example of the related art document on SBD includes Patent Document 1 (JP 2006-156457 A).

In the cross sectional view of FIG. 19, schematically shown is an example of the structure of the SBD. As shown in FIG. 19, an SBD 100 has the stacking structure in which a buffer layer 120, an $n^+$-type GaN layer 122, and an n-type GaN layer 123 are epitaxially grown on a sapphire substrate 101 in this order. On the upper part of the stacking structure, formed is an anode electrode 112 that forms a Schottky junction with the top surface of the n-type GaN layer 123. On another end of the stacking structure that is lower than the upper end portion, formed is a cathode electrode 113 that is in ohmic contact with the $n^+$-type GaN layer 122.

RELATED ART DOCUMENT

Patent Document

Patent Document 1: JP 2006-156457 A

SUMMARY OF INVENTION

Problem to be Solved by the Invention

Among the properties of the semiconductor device, the pressure resistance and the on-state resistance are important. Specifically, in order to obtain a high-performance semiconductor device, it is preferable to increase the pressure resistance as much as possible and to decrease the on-state resistance as much as possible. However, since there is a trade-off between the pressure resistance and the on-state resistance, when the pressure resistance of the semiconductor device is increased, the on-state resistance also is increased. Further, since this relationship depends on the physical properties such as a permittivity, a mobility, and an insulation breakdown electric field of the semiconductor layer in the semiconductor device, the increase in performance by the improvement of the trade-off is very difficult.

Hence, the present invention is intended to provide a semiconductor device in which the trade-off between the pressure resistance and the on-state resistance is improved and the performance is improved.

Means for Solving Problem

In order to achieve the aforementioned object, the semiconductor device of the present invention comprises:
  semiconductor layers;
  an anode electrode; and
  a cathode electrode, wherein
the semiconductor layers include a composition change layer, the anode electrode is electrically connected to one of principal surfaces of the composition change layer through a formation of a Schottky junction between the anode electrode and a part of the semiconductor layers,
the cathode electrode is electrically connected to the other of the principal surfaces of the composition change layer through a formation of a junction between the cathode electrode and another part of the semiconductor layers,
the anode electrode and the cathode electrode are capable of applying a voltage to the composition change layer in a direction perpendicular to the principal surface, and
the composition change layer has composition that changes from a cathode electrode side toward an anode electrode side in the direction perpendicular to the principal surface of the composition change layer, has a negative polarization charge that is generated due to the composition that changes, and contains a donor impurity.

Further, the present invention provides an electronic apparatus comprising the semiconductor device of the present invention.

Moreover, the present invention provides a method of producing the semiconductor device of the present invention comprising:
  a semiconductor layer formation step of forming the semiconductor layers; and
  an electrode junction step of forming a Schottky junction between the anode electrode and a part of the semiconductor layers and of forming a junction between the cathode electrode and another part of the semiconductor layers, wherein
the semiconductor layer formation step comprises a composition change layer formation step, in the composition change layer formation step, the composition change layer is formed such that it generates a negative polarization charge due to its composition that changes in the direction perpendicular to the principal surface and it contains a donor impurity, and
in the electrode junction step, the anode electrode and the cathode electrode are formed so as to be capable of applying a voltage to the composition change layer in the direction perpendicular to the principal surface.

Effects of the Invention

According to the present invention, a semiconductor device in which the trade-off between the pressure resistance and the on-state resistance is improved and the performance is improved can be provided.

DESCRIPTION OF EMBODIMENTS

Figure 1:
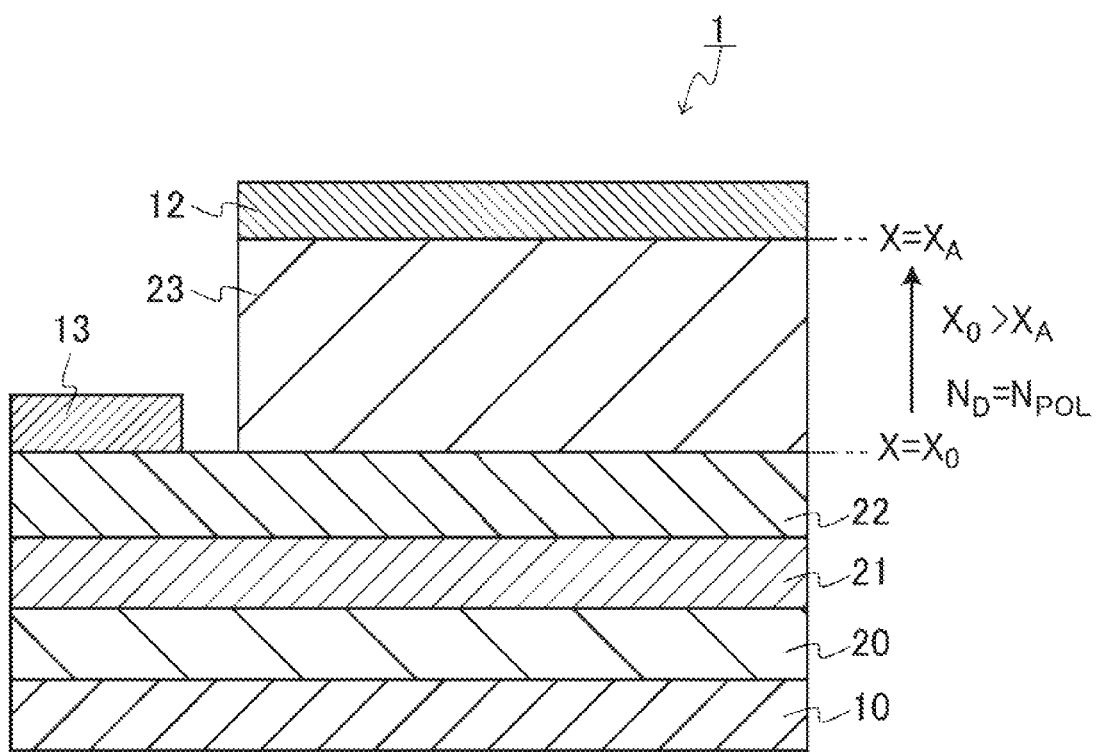
FIG. 1 is a cross sectional view schematically showing the structure of the Schottky barrier diode (SBD), which is the semiconductor device of Embodiment 1.

As described above, the composition change layer of the semiconductor device of the present invention has composition that changes from the cathode electrode side toward the anode electrode side in the direction perpendicular to the principal surface of the composition change layer. Thereby, at the time of application of a voltage between the anode electrode and the cathode electrode, the electric field concentration can be relieved by neutralizing (cancelling) a positive charge that is generated due to the donor impurity contained in the composition change layer by a negative polarization charge that is generated in the composition change layer. Therefore, the semiconductor device of the present invention can improve the trade-off between the pressure resistance and the on-state resistance and achieve a high pressure resistance and a low on-state resistance. This will be described in detail below.

In the present invention, the "composition" represents the quantitative relationship of the number of atoms of elements that configure a semiconductor layer and the like. The "composition ratio" represents the relative ratio between the number of atoms of specific elements that configure the semiconductor layer and the like and the number of atoms of other elements. For example, in the semiconductor layer represented by the composition of $Al_xGa_{1-x}N$, the numerical value of x is referred to as the "Al composition ratio". Further, in the present invention, at the time of defining the composition or the composition ratio of the semiconductor layer, an impurity (dopant) that expresses conductivity or the like shall not be considered as an element that configures the semiconductor layer. For example, although the impurity (dopant) in a p-type GaN layer is different from that in an n-type GaN layer, it is regarded that the composition of the p-type GaN layer is identical to that of the n-type GaN layer. Also, for example, in the case where there are an n-type GaN layer and an $n^+$ GaN layer that has a higher impurity concentration, it is regarded that the composition of the n-type GaN layer is identical to that of the $n^+$ GaN layer. Moreover, in the present invention, the concentration of an impurity in a semiconductor layer is expressed by the number of atoms of the impurity that is present per volume (for example, per $cm^{-3}$) unless otherwise noted.

Further, semiconductors are present in a crystalline state or an amorphous (noncrystalline) state. In the semiconductor device of the present invention, the semiconductor layer is preferably in the crystalline state although it is not particularly limited. Further, more preferably, the crystalline state is a single crystalline state. Moreover, in the present invention, the "principal surface" of a semiconductor layer, a substrate, or the like represents a surface having the largest area of the semiconductor layer, the substrate, or the like, i.e., the front surface or the back surface, or the top surface or the bottom surface.

Further, in the present invention, when the component X and the component Y are present, the positional relationship between X and Y are as follows. First, "Y at the front surface side of X" may represent, unless otherwise noted, the state in which Y is directly in contact with the front surface of X or the state in which another component or the like is present between Y and the front surface of X and Y is not directly in contact with the front surface of X. Similarly, "Y at the back surface side of X" may represent, unless otherwise noted, the state in which Y is directly in contact with the back surface of X or the state in which another component or the like is present between Y and the back surface of X and Y is not directly in contact with the back surface of X. "Y on the front surface of X" represents the state in which Y is directly in contact with the front surface of X. Similarly, "Y on the back surface of X" represents the state in which Y is directly in contact with the back surface of X. "Y over X" or "Y at the top surface side of X" may represent, unless otherwise noted, the state in which Y is directly in contact with the top surface of X or the state in which another component or the like is present between Y and the top surface of X and Y is not directly in contact with the top surface of X. Similarly, "Y under X" or "Y at the bottom surface side of X" may represent, unless otherwise noted, the state in which Y is directly in contact with the bottom surface of X or the state in which another component or the like is present between Y and the bottom surface of X and Y is not directly in contact with the bottom surface of X. Further, "Y on the top surface of X" represents the state in which Y is directly in contact with the top surface of X. Similarly, "Y on the bottom surface of X" represents the state in which Y is directly in contact with the bottom surface of X. "Y at one surface side of X" may represent, unless otherwise noted, the state in which Y is directly in contact with one surface side of X or the state in which another component or the like is present between Y and one surface side of X and Y is not directly in contact with the one surface side of X. The same applies to "Y at the both surface sides of X". "Y on one surface of X" represents the state in which Y is directly in contact with one surface of X. The same applies to "Y on the both surfaces of X".

In the present invention, the "junction" may represent the state in which components are directly in contact with each other or the components form a junction via another component. For example, the state in which an electrode forms a junction with a semiconductor layer may be the state in which the electrode is directly in contact with the semiconductor layer or the state in which the electrode forms a junction with the semiconductor layer via a substrate, an insulation film, another semiconductor layer, or the like. The state represented by the expression "electrically connect" in the present invention is satisfied as long as any electric interaction is possible. For example, the expression may represent the state in which a current can be passed bi-directionally or the state in which components are connected to each other such that rectification is performed. Further, the "electrically connect" may represent the state in which components are directly in contact with each other or the components form a junction via another component. For example, as described above, the anode electrode is electrically connected to one of principal surfaces of the composition change layer through a formation of a Schottky junction between the anode electrode and a part of the semiconductor layers. In this case, the part with which the anode electrode forms a Schottky junction may be the principal surface of the composition change layer or another part of the semiconductor layers. Further, for example, as described above, the cathode electrode is electrically connected to the other of the principal surfaces of the composition change layer through a formation of a junction between the cathode electrode and another part of the semiconductor layers. In this case, the part with which the cathode electrode forms a junction may be the principal surface of the composition change layer or another part of the semiconductor layers. Further, in the present invention, a charge generated by polarization ("polarization charge", "polarization negative charge", or the like) represents a polarization charge that is generated when a voltage is not applied, unless otherwise noted. Examples of the polarization charge that is generated when a voltage is not applied include a so-called spontaneous polarization, and a piezoelectric polarization.

Hereinafter, the Embodiments of the present invention will be described by referring to the figures. However, the present invention is not limited to the following Embodiments. In the figures, identical components are indicated with identical numerals and symbols, and the descriptions of identical parts may be omitted. Further, since mathematical equations are theoretical formulae, an actual phenomenon in the semiconductor device of the present invention or the like may not fully agree with the mathematical equations.

Embodiment 1

Prior to the description of the first Embodiment of the present invention, the relationship between the pressure resistance and the on-state resistance of a semiconductor device will be described with theoretical formulae with reference to the SBD shown in FIG. 19 as an example.

Figure 19:
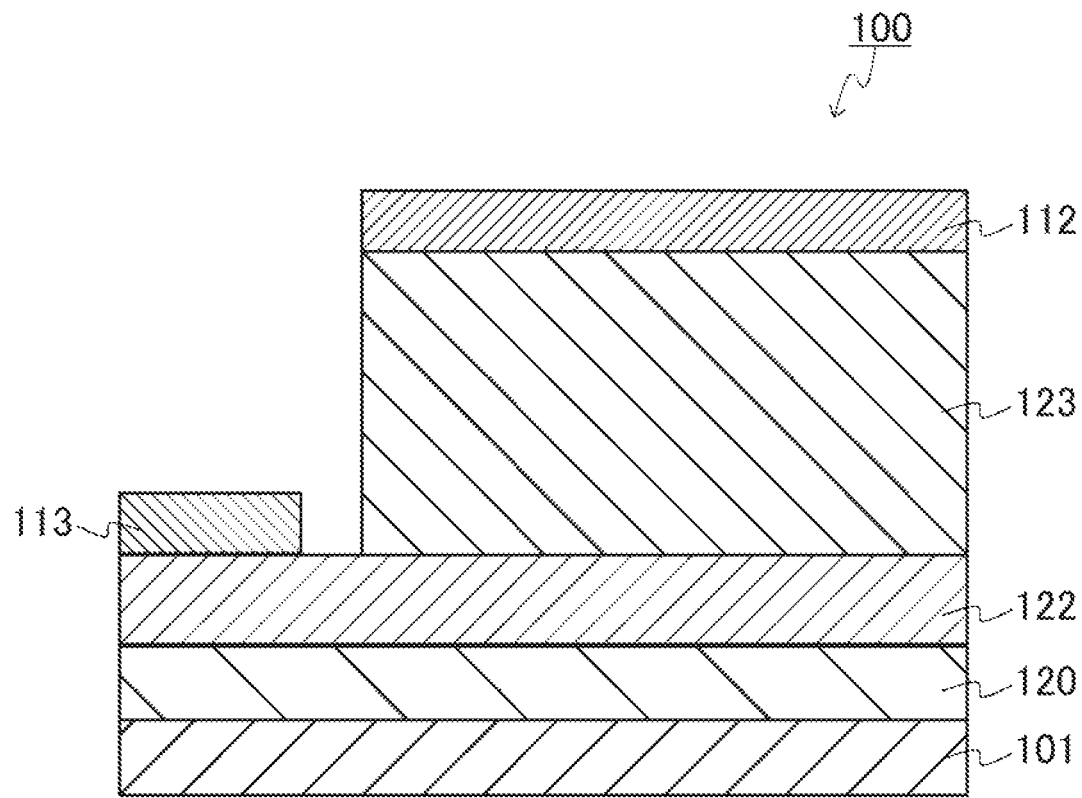
FIG. 19 is a cross sectional view schematically illustrating the structure of an SBD.

First, in the SBD shown in FIG. 19, the value of the electric field intensity of an n-type GaN layer 123 shows a maximum value at the interface between the n-type GaN layer 123 and an anode electrode 112. A maximum value $E_{max}$ (V/m) of the electric field intensity is expressed by the following mathematical equation (1).

[Mathematical Equation 1]

$$E_{max} = \frac{2(V_{bi} - V - kT/q)}{W} \quad (1)$$

In the mathematical equation (1), the meanings of the symbols are as follows:
$V_{bi}$: built-in-potential (V)
k: Boltzmann constant (J/K)
T: temperature (K)
q: elementary charge (elementary electric charge) (C)
W: depletion layer width (m) in n-type GaN layer 123 at anode electrode 112 side Further, the depletion layer width W at the anode electrode 112 side in the mathematical equation (1) can be expressed by the following mathematical equation (2).

[Mathematical Equation 2]

$$W = \sqrt{\frac{2\varepsilon_s}{qN_D}\left(V_{bi} - V - \frac{kT}{q}\right)} \quad (2)$$

In the mathematical equation (2), the meanings of the symbols are as follows:
$\varepsilon_s$: permittivity (F/m)
$N_D$: donor impurity concentration (m$^{-3}$) of n-type GaN layer 123

It is to be noted that the mathematical equations (1) and (2) are based on the theory described in S. M. Sze, "*Physics of Semiconductor Devices*," John Wiley & Sons, 2nd edition, 1981. The following mathematical equation (3) can be derived from the mathematical equations (1) and (2).

[Mathematical Equation 3]

$$|V| = \frac{\varepsilon_s E_{max}^2}{2qN_D} - V_{bi} + \frac{kT}{q} \quad (3)$$

When the maximum value $E_{max}$ of the electric field intensity reaches the insulation breakdown electric field $E_{crit}$ (V/m) of the semiconductor, a breakdown is caused. Therefore, the pressure resistance of $V_B$ (V) is expressed by the following mathematical equation (4).

[Mathematical Equation 4]

$$V_B = \frac{\varepsilon_s E_{crit}^2}{2qN_D} - V_{bi} + \frac{kT}{q}. \quad (4)$$

In other words, the pressure resistance $V_D$ of the SBD shown in FIG. 19 depends on the donor impurity concentration $N_D$ of the n-type GaN layer 123. It is to be noted that the aforementioned relationship holds for the condition in which a depletion layer is sufficiently stretched in a semiconductor layer (i.e., the condition in which the semiconductor has the thickness where a neutral region can be present). When the thickness of the semiconductor of this time is defined as $d_{min}$ (m), since $d_{min}$ is equal to the depletion layer width of the n-type semiconductor layer of the condition in which the semiconductor reaches the insulation breakdown electric field, the following mathematical equation (5) can be derived from the mathematical equations (1) and (2).

[Mathematical Equation 5]

$$d_{min} = \frac{\varepsilon_s E_{crit}}{qN_D} \quad (5)$$

On the other hand, the on-state resistance $R_{on}$ (Ω·m$^2$) that is an important indicator of performance of the SBD along with the pressure resistance is expressed by the following mathematical equation (6).

[Mathematical Equation 6]

$$R_{on} = \frac{d}{qn\mu} \quad (6)$$

In the mathematical equation (6), the meanings of the symbols are as follows:
μ: mobility (m²/V·s)
n: carrier concentration (m⁻³)

Since it can be considered that the carrier concentration n is subequal to the impurity concentration $N_D$, on the basis of the mathematical equations (5) and (6), a minimum value of the on-state resistance is expressed by the following mathematical equation (7).

[Mathematical Equation 7]

$$R_{on} = \frac{\varepsilon_s E_{crit}}{q^2 N_D^2 \mu} \quad (7)$$

Here, when the approximation of $V_B \gg |V_{bi} - kT/q|$ is used, the relationship of the following mathematical equation (8) between the pressure resistance and the on-state resistance can be derived from the mathematical equations (4) and (7).

[Mathematical Equation 8]

$$R_{on} = \frac{4 V_B^2}{\varepsilon_s \mu E_{crit}^3} \quad (8)$$

As indicated in the mathematical equation (8), there is a trade-off between the pressure resistance and the on-state resistance such that the on-state resistance $R_{on}$ also is increased to achieve the SBD having a high pressure resistance $V_B$. Further, since the foregoing relationship depends on the physical properties such as a permittivity, a mobility, and an insulation breakdown electric field of the semiconductor layer (GaN in FIG. 19), the increase in performance by the improvement of the trade-off is very difficult. The mathematical equations (1) to (8) apply not only to the SBD but also to the semiconductor devices in general. Therefore, the foregoing problem is a common problem among the semiconductor devices in general.

Hereinafter, the first Embodiment of the present invention will be described. In the cross sectional view of FIG. 1, schematically shown is the structure of the semiconductor device of this Embodiment. A semiconductor device 1 shown in FIG. 1 is a Schottky barrier diode (SBD). It is to be noted that the semiconductor device of the present invention is preferably a Schottky barrier diode (SBD) although it is not particularly limited. This Embodiment and the following Embodiments will be described mainly with reference to a Schottky barrier diode (SBD):

As shown in FIG. 1, the Schottky barrier diode (SBD) 1 of this Embodiment includes semiconductor layers, an anode electrode 12, and a cathode electrode 13 as main components, and further includes a substrate (support substrate) 10. The substrate 10 is, for example, a sapphire substrate. The semiconductor layers include a first buffer layer 20, a second buffer layer 21, an n⁺-type compound semiconductor layer 22, and an n-type compound semiconductor layer 23. The first buffer layer 20, the second buffer layer 21, the n⁺-type compound semiconductor layer 22, and the n-type compound semiconductor layer 23 are stacked over the substrate 10 in this order. The n-type compound semiconductor layer 23 is a composition change layer. A part of the n-type compound semiconductor layer 23 is removed. At the part where the part of the n-type compound semiconductor layer 23 is removed, the top surface of the n⁺-type compound semiconductor layer 22 is exposed. The anode electrode 12 forms a Schottky junction with the top surface of the n-type compound semiconductor layer 23. The cathode electrode 13 forms a junction with the exposed top surface of the n⁺-type compound semiconductor layer 22. In this Embodiment, the junction between the cathode electrode 13 and the n⁺-type compound semiconductor layer 22 is an ohmic contact. In the Schottky barrier diode (SBD) 1, a voltage can be applied to the n-type compound semiconductor layer (composition change layer) 23 in the direction perpendicular to the principal surface thereof by application of a voltage between the anode electrode 12 and the cathode electrode 13. The n-type compound semiconductor layer (composition change layer) 23 has composition that changes from the cathode electrode 13 side toward the anode electrode 12 side in the direction perpendicular to the principal surface of the n-type compound semiconductor layer (composition change layer) 23. The n-type compound semiconductor layer (composition change layer) 23 contains a donor impurity. At the time of application of a voltage between the anode electrode 12 and the cathode electrode 13, the n-type compound semiconductor layer (composition change layer) 23 can relieve the electric field concentration by neutralizing a positive charge that is generated in the n-type compound semiconductor layer (composition change layer) 23 due to the donor impurity by a negative polarization charge that is generated in the n-type compound semiconductor layer (composition change layer) 23.

The concentration of the donor impurity added to the n⁺-type compound semiconductor layer 22 is higher than that of the donor impurity added to the n-type compound semiconductor layer (composition change layer) 23. The first buffer layer 20, the second buffer layer 21, the n⁺-type compound semiconductor layer 22, and the n-type compound semiconductor layer 23 can be formed, for example, of a III-nitride semiconductor, and they can be formed over the substrate 10, for example, by epitaxial growth. The first buffer layer 20 and the second buffer layer 21 each have a function of relieving the lattice constant difference between the substrate 10 and the n⁺-type compound semiconductor layer 22. Particularly, the second buffer layer 21 has a function of determining the lattice constant of each of the n⁺-type compound semiconductor layer 22 and the n-type compound semiconductor layer 23, which are crystal-grown over the second buffer layer 21.

As described above, the n-type compound semiconductor layer (composition change layer) 23 has composition that changes from the lowest part (cathode electrode 13 side) toward the uppermost part (anode electrode 12 side) in the direction perpendicular to the principal surface of the n-type compound semiconductor layer (composition change layer) 23 (hereinafter, this may be referred to as the "composition distribution"). The n-type compound semiconductor layer 23 can generate a negative polarization charge therein due to the composition distribution. The n-type compound semiconductor layer 23 can be formed, for example, of $Al_xGa_{1-x}N$ ($0 \leq x < 1$) into which a donor impurity such as silicon is introduced. This n-type compound semiconductor layer (n-type $Al_xGa_{1-x}N$ layer) 23 has the Al composition ratio of $x=x_0$ ($x_0>0$) at the lowest part (the principal surface at the cathode electrode side, i.e., the interface between the n-type compound semiconductor layer 23 and the n⁺-type compound semiconductor layer 22) and has the Al composition ratio of $x=x_A$ ($x_A \geq 0$) at the uppermost part (the principal surface at the anode electrode side, i.e., the interface between the n-type compound semiconductor layer 23 and the anode electrode 12). In the n-type $Al_xGa_{1-x}N$ layer 23, the Al composition ratio x changes from $x_0$ to $x_A$ from the lowest part (cathode electrode 13 side) toward the uppermost part (anode electrode 12 side) continuously or in a stepwise manner on a molecular layer basis (angstrom order). Further, in the n-type $Al_xGa_{1-x}N$ layer 23, the following equation is satisfied: $x_0 > x_A$. In other words, the Al composition ratio x decreases from the lowest part (cathode electrode 13 side) toward the uppermost part (anode electrode 12 side) of the n-type $Al_xGa_{1-x}N$ layer 23 continuously or in a stepwise manner on a molecular layer basis. It is to be noted that, 1 angstrom (Å) is equal to $10^{-10}$ m, i.e., 0.1 nm.

The n⁺-type compound semiconductor layer 22 can be formed, for example, of $Al_yGa_{1-y}N$ ($0 \leq y < 1$) into which a donor impurity such as silicon is introduced at high concentrations. The n⁺-type compound semiconductor layer 22 has the Al composition ratio y that is uniform over the entire structure. This Al composition ratio y is subequal to the Al composition ratio $x_0$ at the lowest part of the n-type compound semiconductor layer 23. In other words, it satisfies the following equation: $y=x_0$ or $y \approx x_0$.

The relationship between the pressure resistance and the on-state resistance of the Schottky barrier diode (SBD) 1 having the aforementioned configuration will be described. Here, the second buffer layer 21 shall be an AlGaN buffer layer and the n⁺-type compound semiconductor layer 22 shall be an n⁺-type AlGaN layer. It is assumed that the lowest parts of the AlGaN buffer layer 21, the n⁺-type AlGaN layer 22, and the n-type AlGaN layer 23 all have the same Al composition ratio $x_0$. The Al composition ratio of the uppermost part of the n-type $Al_xGa_{1-x}N$ layer 23 is $x_A$. It is assumed that the Al composition ratio x of the n-type AlGaN layer 23 changes from the lowest part (cathode electrode 13 side) toward the uppermost part (anode electrode 12 side) of the n-type AlGaN layer 23 in K steps. Here, K is an integer more than 1. When the value of K is sufficiently large, it can be regarded that the composition change is continuous. For example, when the composition of the composition change layer changes in a stepwise manner on a molecular layer basis (angstrom order), it can be regarded that the composition change of the composition change layer is virtually continuous. Hereinafter, the Al composition ratio of the layer in the n-type $Al_xGa_{1-x}N$ layer 23 at the $k^{th}$ from the bottom is represented by $x_k$. Here, k is an integer from 0 to K. The equation k=0 represents the lowest end of the n-type $Al_xGa_{1-x}N$ layer 23, i.e., the principal surface at the cathode electrode 13 side (the interface between the n-type $Al_xGa_{1-x}N$ layer 23 and the n-type AlGaN layer 22).

Hereinafter, the semiconductor device (SBD) of this Embodiment shown in FIG. 1 will be described using theoretical formulae. First, according to O. Ambacher, et al., "Pyroelectric properties of Al(In)GaN/GaN hetero- and quantum well structures," *Journal of Physics C: Condensed Matter*, Vol. 14, pp. 3399-3434 (2002), the spontaneous polarization charge $P_{SP}$ that is generated in the AlGaN layer having the Al composition ratio $x_k$ is expressed by the following mathematical equation (9). The unit of the $P_{SP}$ is C/m² = C·m⁻² as described in the mathematical equation (9).

[Mathematical Equation 9]

$$P_{SP}^{AlGaN}(x_k) = -0.090 x_k - 0.034(1-x_k) + 0.021 x_k(1-x_k) \quad [C \cdot m^{-2}] \quad (9)$$

Here, the distortion $\epsilon_k$ of the layer in the n-type $Al_xGa_{1-x}N$ layer 23 at the $k^{th}$ from the bottom is defined as the following mathematical equation (10).

[Mathematical Equation 10]

$$\varepsilon_k = \frac{a_0 - a_k}{a_k} \quad (10)$$

In the mathematical equation (10), the meanings of the symbols are as follows:

$a_0$: lattice constant at interface between n-type $Al_xGa_{1-x}N$ layer 23 and n-type AlGaN layer 22

$a_k$: lattice constant of layer (Al composition ratio $x_k$) in n-type $Al_xGa_{1-x}N$ layer 23 at $k^{th}$ from bottom In this Embodiment, the Al composition ratio of the n-type $Al_xGa_{1-x}N$ layer 23 decreases as it goes toward the upper part from the lower part. Therefore, the nearer the uppermost part, the larger the lattice constant of the n-type $Al_xGa_{1-x}N$ layer 23. Accordingly, as is obvious from the mathematical equation (10), in the n-type $Al_xGa_{1-x}N$ layer 23, the following equation is satisfied: $\epsilon_k < 0$. At this time, the piezoelectric polarization charge $P_{PZ}$ that is generated in the n-type $Al_xGa_{1-x}N$ layer 23 is given by the following mathematical equation (11). The unit of the $P_{PZ}$ is C/m² = C·m⁻² as described in the following mathematical equation (11).

[Mathematical Equation 11]

$$P_{PZ}^{AlGaN}(x_k) = -0.918\epsilon_k + 9.541\epsilon_k^2 - (0.89\epsilon_k + 3.915\epsilon_k^2)x_k \quad [C \cdot m^{-2}] \quad (11)$$

The polarization charge $P_{POL}$, in the n-type $Al_xGa_{1-x}N$ layer 23 is given by the following mathematical equation (12).

[Mathematical Equation 12]

$$P_{POL}^{AlGaN}(x_k) = P_{SP}^{AlGaN}(x_k) + P_{PZ}^{AlGaN}(x_k) \quad (12)$$

In the n-type $Al_xGa_{1-x}N$ layer 23, the difference of the polarization charge is caused between the AlGaN layer at the $k-1^{th}$ from the bottom and the AlGaN layer at the $k^{th}$ from the bottom, and the negative charge $\Delta\sigma_k$ (C·m⁻²) corresponding to the difference is present at the interface between the both layers. The negative charge $\Delta\sigma_k$ (C·m⁻²) is expressed by the following mathematical equation (13).

[Mathematical Equation 13]

$$\Delta\sigma_k = P_{POL}^{AlGaN}(x_k) - P_{POL}^{AlGaN}(x_{k-1}) \quad (13)$$

When the volume density of the negative charge that has been generated at the interface between the both layers is defined as $N_{POL}$ and the thickness of the AlGaN layer at the $k^{th}$ from the bottom is defined as $t_k$ (m), the volume density $N_{POL}$ (C·m⁻³) is given by the following mathematical equation (14).

[Mathematical Equation 14]

$$N_{POL} = \frac{\Delta\sigma_k}{t_k} \quad (14)$$

Figure 2:
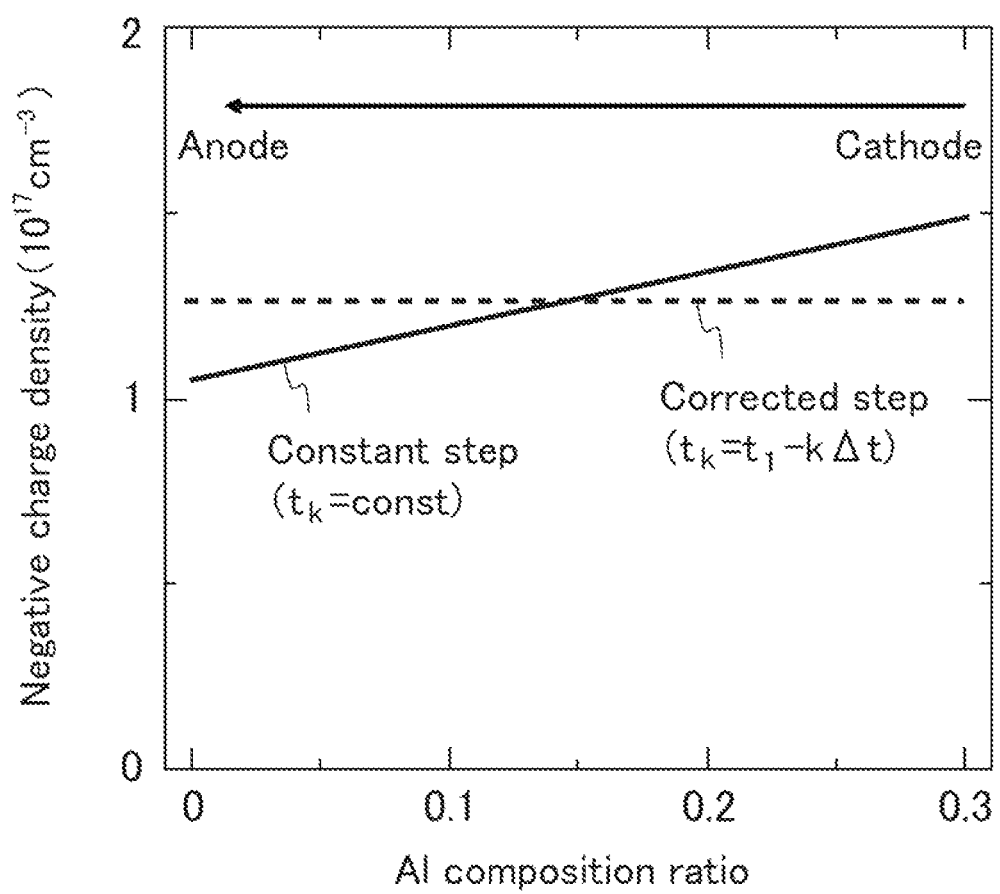
FIG. 2 is a graph illustrating the relationship between the Al composition ratio and the negative charge density in the composition change layer of the semiconductor device of the present invention.

In the graph of FIG. 2, shown is the relationship between the Al composition ratio x and the negative charge density in the n-type $Al_xGa_{1-x}N$ layer 23 that are calculated with the following conditions: $x_0=0.3$, $x_A=0$ (i.e., the top surface of the n-type AlGaN layer 23 is the GaN surface), and K=100. In FIG. 2, the horizontal axis shows the Al composition ratio and the vertical axis shows the negative charge density (q/cm$^{-3}$). It is to be noted that, in FIG. 2, the description of the "q (elementary charge)" of the unit of the negative charge density is omitted. In the present invention, with respect to the charge density, the density or the concentration that is obtained by converting the multiples of "q (elementary charge)" to the absolute value is described unless otherwise noted. For example, when the unit of the charge density is simply represented by "m$^{-3}$", it shall indicate the absolute value that is obtained by dividing a charge that is present in m$^{-3}$ by q (elementary charge). Further, in the present invention, with respect to the impurity concentration, the density or the concentration that is obtained by converting a maximum value of the charge that can be generated due to the impurity to the absolute value of the multiples of "q (elementary charge)" is described unless otherwise noted. For example, when the unit of the impurity concentration is simply represented by "m$^{-3}$", it shall indicate the absolute value that is obtained by dividing a maximum value of the charge that can be generated due to the impurity that is present in 1 m$^{-3}$ by q (elementary charge). A maximum value of the charge that can be generated due to the impurity is equal to the charge that is generated due to the impurity of the case where the activation rate (ionization rate) of the impurity is 100%. In FIG. 2, it was calculated on the premise that the total thickness $t_{AlGaN}$ ($=t_0+t_1+\ldots+t_K$) of the AlGaN layer (n-type $Al_xGa_{1-x}N$ layer) having composition that changes continuously (hereinafter this may be referred to as the "graded composition") was 1 µm. In FIG. 2, the solid line indicated with "constant step" shows the result of the case where $t_k$ was constant (10 nm). As can be seen from FIG. 2, the negative charge density decreases approximately linearly from the cathode electrode 13 side toward the anode electrode 12 side. In this case, the change of ±17% relative to the average negative charge density is generated. Also in such a charge distribution density, sufficient effects such as the cancellation of the positive charge due to the donor impurity and the improvement of the trade-off between the pressure resistance and the on-state resistance can be obtained. Hereinafter, making the negative charge density constant will be considered.

That is, as shown in FIG. 2, since the surface density of the negative charge at the anode electrode 12 side is high when $t_k$ is constant (10 nm), the volume density can be made constant by thinning $t_k$ in accordance with the decrease in the surface density. In other words, when the thickness of the 1$^{st}$ layer from the bottom is defined as $t_1$, the foregoing can be made by thinning $t_k$ according to the following mathematical equation (15).

[Mathematical Equation 15]

$$t_k = t_1 - (k-1)\Delta t \quad (15)$$

In this manner, based on the premise that the composition change layer includes plural layers, if the thickness of the layer at the side where the Al composition ratio is high (the cathode electrode side) is designed large and the thickness of the layer at the side where the Al composition ratio is low (the anode electrode side) is designed small, the configuration in which the decreasing gradient of the Al composition ratio of the composition change layer is a steep gradient from the cathode electrode side toward the anode electrode side can be obtained. This makes it possible to make the negative charge density of the composition change layer uniform from the cathode electrode side to the anode electrode side as shown by the dashed line that is indicated with "corrected step" in FIG. 2, for example. This can be applied not only to the case where the thicknesses of the plural layers are sufficiently small and the composition change of the composition change layer can be regarded as continuous but also to the case where the thicknesses of the plural layers are large and the composition change of the composition change layer is stepwise.

Here, when the average of the negative charge density (C·m$^{-3}$) is defined as $N_{POL}^{AVG}$ and the difference is defined as $\Delta N_{POL}$, the following mathematical equation (16) holds.

[Mathematical Equation 16]

$$\Delta t = \frac{t_{AlGaN}}{K} \frac{\Delta N_{POL}}{N_{POL}^{AVG}}. \quad (16)$$

Figure 3:
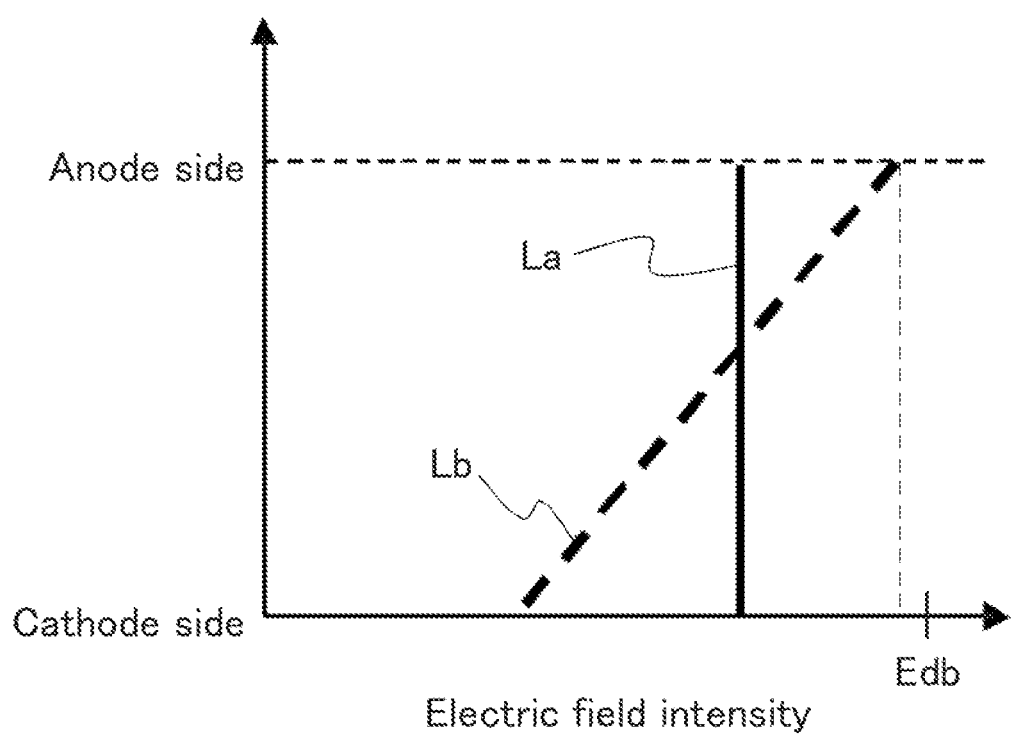
FIG. 3 is a graph schematically illustrating the electric field intensity at the time of application of a reverse direction bias in the composition change layer of the semiconductor device of Embodiment 1.

When the graded composition AlGaN layer that has such a negative charge density distribution is doped with a donor impurity of $N_D=N_{POL}$ as shown in FIG. 1, the electric field at the time of application of a reverse direction bias (reverse bias) is at a constant value as in the case of an intrinsic semiconductor. The graph of FIG. 3 schematically shows this relationship. In FIG. 3, the horizontal axis shows the electric field intensity and the vertical axis shows a position in the AlGaN layer of the semiconductor device from the cathode electrode side toward the anode electrode side in the direction perpendicular to the principal surface. In FIG. 3, La indicates the n-type $Al_xGa_{1-x}N$ layer 23 of the semiconductor device (SBD) 1 shown in FIG. 1. Lb indicates the AlGaN layer of the semiconductor device that is similar to the semiconductor device (SBD) 1 shown in FIG. 1 except that it includes an AlGaN layer having no composition gradient (change) in place of the n-type $Al_xGa_{1-x}N$ layer 23. The thickness of the AlGaN layer of Lb is identical to that of the n-type $Al_xGa_{1-x}N$ layer 23. Further, conditions for applying the reverse direction bias in the case of La are identical to those in Lb.

As shown in FIG. 3, La is the line showing the electric field intensity that is approximately uniform over the composition change layer (n-type $Al_xGa_{1-x}N$ layer 23) from the cathode side (cathode electrode 13 side) to the anode side (anode electrode 12 side). On the other hand, as indicated by the line $L_b$ in FIG. 3, the electric field intensity changes according to the linear function in the layer having no composition change. Therefore, as indicated by the line $L_b$, the layer having no composition change (AlGaN layer) has a maximum value of the electric field intensity at the principal surface (directly beneath the anode electrode) at the anode electrode side. Therefore, the thickness of the layer having no composition change (AlGaN layer) should be designed so that a maximum value of the electric field intensity does not exceed the insulation breakdown electric field $E_{db}$ (V/m). Here, since a maximum value of the electric field intensity is low in the SBD (this Embodiment) shown in FIG. 1 as indicated by the line $L_a$, a higher reverse direction bias can be applied. This means the improvement of the pressure resistance. Hereinafter, this effect will be described in detail.

Since the SBD (this Embodiment) shown in FIG. 1 satisfies the mathematical equation (16) and the electric field intensity of the SBD is uniform as shown in FIG. 3, the thickness $d_B$ of the semiconductor layer that is necessary for achieving the pressure resistance $V_B$ is given by the following mathematical equation (17).

[Mathematical Equation 17]

$$d_B = \frac{V_B}{E_{crit}} \quad (17)$$

The surface density of the polarization charge that can be generated in the SBD of this Embodiment is calculated as in the following mathematical equation (18) based on the mathematical equation (13).

[Mathematical Equation 18]

$$\sum_{k=1}^{K} \Delta \sigma_k = \sum_{k=1}^{K} (P_{POL}^{AlGaN}(x_k) - P_{POL}^{AlGaN}(x_{k-1})) \quad (18)$$
$$= P_{POL}^{AlGaN}(x_K) - P_{POL}^{AlGaN}(x_0)$$
$$= P_{POL}^{AlGaN}(x_A)$$

In other words, this surface density is equal to the surface density of the case where the AlGaN layer of the Al composition ratio $x_A$ is formed over the AlGaN buffer layer of the Al composition ratio $x_0$.

Based on the mathematical equations (17) and (18), the volume density $N_{POL}^{MAX}$ (C·m$^{-3}$) of the polarization charge that can be generated in the case where the pressure resistance of the SBD of this Embodiment is $V_B$ is given by the following mathematical equation (19).

[Mathematical Equation 19]

$$N_{POL}^{MAX} = \frac{P_{POL}^{AlGaN}(x_A)}{d_B} \quad (19)$$

Since doping of the donor impurity having the same concentration as this volume density $N_{POL}^{MAX}$ can be performed in this Embodiment, based on the mathematical equation (6), the on-state resistance ($\Omega \cdot m^2$) is given by the following mathematical equation (20).

[Mathematical Equation 20]

$$R_{on} = \frac{d_B}{q N_{POL}^{MAX} \mu} \quad (20)$$

The following mathematical equation (21) indicating the on-state resistance $R_{on}$ can be derived from the mathematical equations (17), (19), and (20).

[Mathematical Equation 21]

$$R_{on} = \frac{V_B^2}{q \mu P_{POL}^{AlGaN}(x_A) E_{crit}^2} \quad (21)$$

Figure 4:
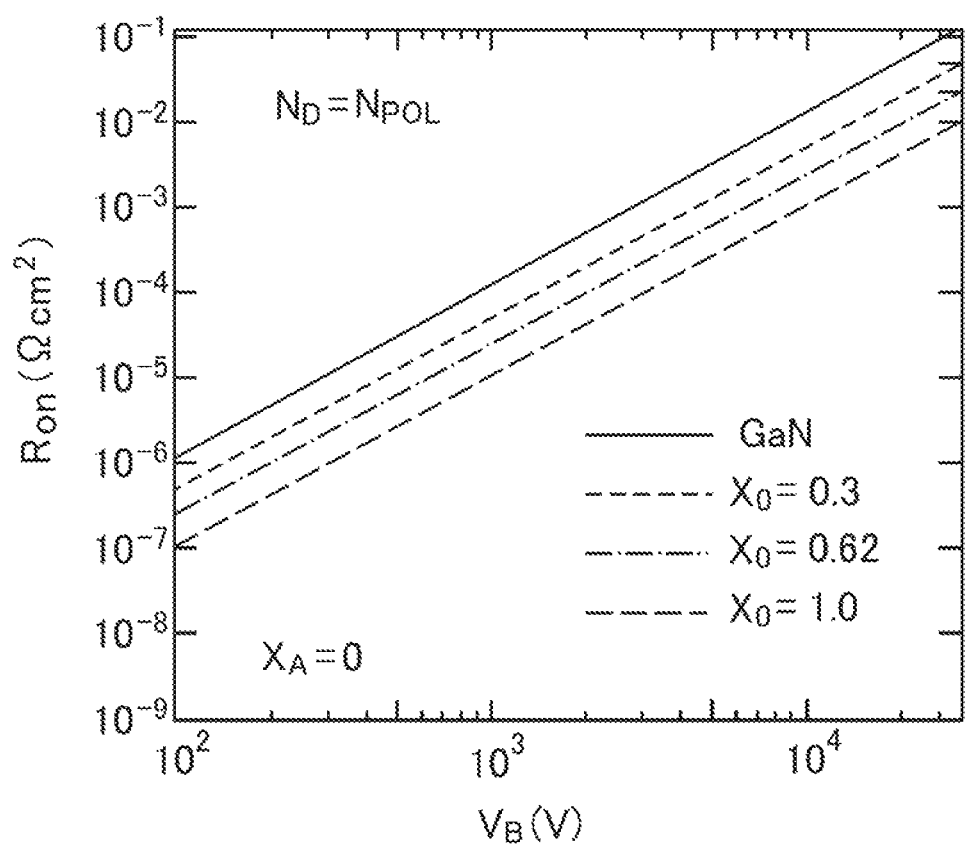
FIG. 4 is a graph plotting an illustration of the relationship between the on-state resistance and the pressure resistance in the semiconductor device of Embodiment 1.

In the graph of FIG. 4, shown is a result obtained by plotting the relationship between the on-state resistance $R_{on}$ and the pressure resistance $V_B$ on the basis of the mathematical equations (8) and (21). In FIG. 4, the vertical axis shows the on-state resistance $R_{on}$ and the horizontal axis shows the pressure resistance $V_B$. In FIG. 4, three dashed lines show plots of the cases in which x of the Al$_x$Ga$_{1-x}$N layer 23 is continuously decreased from the values of $x_0$ (0.3, 0.62, and 1.0) shown in FIG. 4 to $x_A$=0 in the SBD of this Embodiment. The solid line shows a plot of the SBD in which the composition ratio of the Al$_x$Ga$_{1-x}$N layer 23 is constant at x=0 (i.e., the Al$_x$Ga$_{1-x}$N layer 23 is a GaN layer). As shown in FIG. 4, compared with the GaN layer indicated by the solid line, the Al$_x$Ga$_{1-x}$N layer 23 having composition that changes from $x_0$=0.3 to $x_A$=0 can decrease the on-state resistance of the SBD to ⅓ at the same pressure resistance. The on-state resistance at the same pressure resistance can be decreased to 15% of the GaN layer by further increasing a polarization charge with $x_0$=0.62 and can be decreased to 8% of the GaN layer by generating a maximum polarization charge in this system with $x_0$=1.0. This tells that the SBD of this Embodiment can greatly decrease the on-state resistance at the same pressure resistance as compared to the SBD that does not have the composition change layer.

The semiconductor device of the present invention is preferably produced by the production method of the present invention although it is not particularly limited. The method of producing the semiconductor device 1 shown in FIG. 1 is not particularly limited and is, for example, as follows. That is, first, a substrate 10 made of sapphire is provided. Next, a semiconductor layer having the stacking structure of a III-nitride semiconductor is formed over the substrate 10, for example, by the molecular beam epitaxy (MBE) (semiconductor layer formation step). The formation of the semiconductor layer is performed by allowing the first buffer layer 20 (thickness: 20 nm) made of undoped AlN, the second buffer layer 21 (thickness; 2 μm) made of undoped AlGaN, the compound semiconductor layer 22 (thickness: 500 nm, doping concentration (donor impurity concentration): 3×10$^{18}$ cm$^{-3}$, and Al composition ratio: y=0.3) made of n$^+$-type AlGaN, and the compound semiconductor layer 23 (thickness: 1.8 μm and doping concentration (donor impurity concentration): 7.1×10$^{16}$ cm$^{-3}$) made of n-type AlGaN to be grown from the substrate 10 side in this order. The n$^+$-type compound semiconductor layer 22 is allowed to be grown such that the Ga surface becomes the top surface.

Here, the n-type compound semiconductor layer 23 is formed by allowing it to be grown such that it has the Al composition ratio of x=0.3 at the bottom surface and has the Al composition ratio of x=0 at the top surface (composition change layer formation step). The Al composition ratio x is controlled such that it changes from the bottom surface toward the top surface of the n-type compound semiconductor layer 23 continuously or in a stepwise manner on a molecular layer basis (angstrom order). Here, in order to adjust the change of the composition (composition distribution) of the n-type compound semiconductor layer (composition change layer) 23 and the distribution of the donor impurity concentration, for example, the composition, the irradiation time, or the like of a molecular (atomic) beam may be adjusted appropriately in the MBE. The same applies to the following Embodiments and also applies to the case where the composition change layer is formed of other than AlGaN.

Next, a part of the n-type compound semiconductor layer 23, is removed by etching until the top surface of the n$^+$-type compound semiconductor layer 22 is exposed. Further, the electrode junction step in which the anode electrode forms a Schottky junction with a part of the semiconductor layer and the cathode electrode forms a junction with another part of the semiconductor layer is performed. That is, first, over the exposed surface of the n$^+$-type compound semiconductor layer 22 that is made by the etching, for example, the cathode electrode 13 is formed by vapor deposition of a metal film such as a Ti/Al multilayer film. Thereafter, an ohmic contact between the cathode electrode 13 and the n$^+$-type compound semiconductor layer 22 is released by annealing at 650° C. Further, over the n-type compound semiconductor layer 23, for example, the anode electrode 12 is formed by vapor deposition of a metal film such as a Ni/Au multilayer film.

The semiconductor device (SBD) 1 can be produced (made) in this manner.

As described above, compared with the semiconductor device (SBD) in which the n-type compound semiconductor layer 23 is replaced with a layer having no composition change, the semiconductor device (SBD) of this Embodiment can decrease the on-state resistance at the same pressure resistance. On the other hand, when the thickness of the n-type semiconductor layer 23 is the same as that of the layer having no composition change, a higher pressure resistance can be obtained at the same on-state resistance. Details are as follows. That is, first, the semiconductor device 1 of this Embodiment has a composition distribution that changes from the lower part to the upper part (graded composition) of the n-type compound semiconductor layer 23. The n-type compound semiconductor layer 23 has a crystal distortion that changes from the lower part toward the upper part due to the foregoing composition distribution, and the distribution of this crystal distortion generates a negative polarization charge in the n-type compound semiconductor layer 23. When a reverse direction bias is applied between the anode electrode 12 and the cathode electrode 13 of the semiconductor device 1, a depletion layer spreads inside the n-type compound semiconductor layer 23. A positive charge due to the donor impurity contained in the n-type compound semiconductor layer 23 is generated because of the spread of the depletion layer. In the n-type compound semiconductor layer 23, by cancelling (neutralizing) the positive charge by the negative polarization charge, a peak electric field intensity in the n-type compound semiconductor layer 23 is suppressed (relieved). As a result, the semiconductor device 1 of this Embodiment can achieve a higher pressure resistance than the SBD that does not have a composition change layer. On the other hand, since the composition distribution of the n-type compound semiconductor layer 23 does not affect the carrier concentration at the time of application of a forward bias, the on-state resistance does not change. In other words, the semiconductor device 1 of this Embodiment can improve the trade-off between the on-state resistance and the pressure resistance beyond the physical limit.

In the description of the semiconductor device shown in FIG. 1, a compound semiconductor layer formed of a III-nitride semiconductor is used as the semiconductor layer. However, in the semiconductor device of the present invention, the semiconductor layer is not limited thereto. The semiconductor layer may be formed, for example, of a III-V-compound semiconductor or the like. The semiconductor layer may contain or not contain a III-V-nitride semiconductor. The semiconductor layer is preferably formed of a nitride semiconductor layer, is more preferably formed of a III-V-nitride semiconductor, and is particularly preferably formed of a III-nitride semiconductor. It is to be noted that, in the present invention, the "nitride semiconductor" represents semiconductors in general that contain nitrogen and includes the "III-V-nitride semiconductor" and the "III-nitride semiconductor". The "III-V-compound semiconductor" represents semiconductors in general that contain group III elements and group V elements, and examples thereof include GaAs and InP. Further, since nitrogen is a group V element, the "III-V-nitride semiconductor" and the "III-nitride semiconductor" are also included in the "III-V-compound semiconductor". The "III-V-nitride semiconductor" represents nitride semiconductors in general that contain group III elements and group V elements, examples thereof include GaAsN, and it also includes the "III-nitride semiconductor". The "III-nitride semiconductor" represents semiconductors in general that contain group III elements, and examples thereof include AlN, GaN, AlGaN, InGaN, and InAlGaN. Further, in the semiconductor device shown in FIG. 1, the substrate 10 is not limited to a sapphire substrate and any substrate can be employed. For example, the substrate 10 may be a Si substrate, a SiC substrate, a GaN substrate, or the like.

Further, the substrate is not limited to a single material and may be a substrate composed of plural materials such as silicon-on-insulator (SOI). The same applies to the following Embodiments.

Further, in this Embodiment, the junction plane between the cathode electrode and the semiconductor layer and the principal surface of the composition change layer at the cathode electrode side are arranged on the same level. However, the semiconductor device of the present invention is not limited thereto. For example, the cathode electrode may be formed at the top surface side of the semiconductor layer or may be formed at the bottom surface side of the semiconductor layer. Further, for example, the cathode electrode is preferably in ohmic contact with the semiconductor layer as in this Embodiment.

Embodiment 2

Next, the second Embodiment of the present invention will be described.

Figure 5:
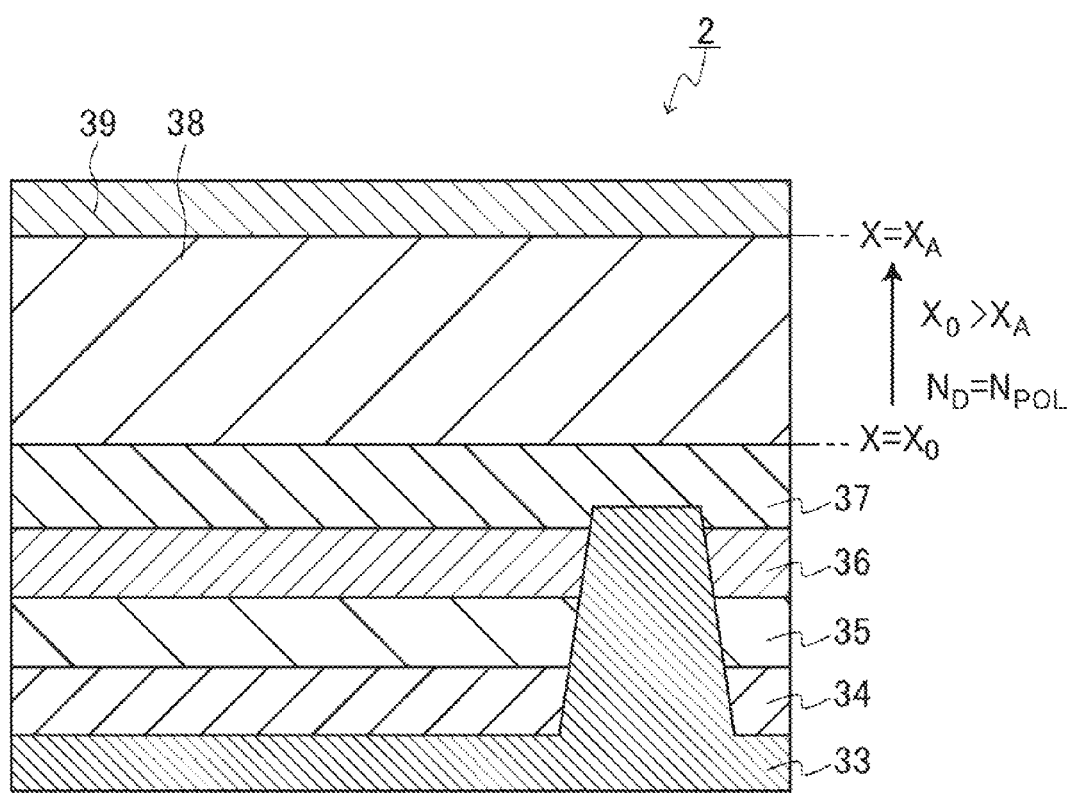
FIG. 5 is a cross sectional view schematically showing the structure of the SBD, which is the semiconductor device of Embodiment 2.

In the cross sectional view of FIG. 5, schematically shown is the structure of the SBD 2, which is the semiconductor device of this Embodiment. As shown in FIG. 5, the semiconductor device (SBD) 2 includes semiconductor layers, an anode electrode 39, and a cathode electrode 33 as main components, and further includes a substrate (support substrate) 34. The substrate 34 is, for example, silicone carbide (SiC). The semiconductor layers include a first buffer layer 35, a second buffer layer 36, an $n^+$-type compound semiconductor layer 37, and an n-type compound semiconductor layer 38. These layers are stacked over the substrate 34 in this order. These layers can be formed, for example, of a III-nitride semiconductor. Further, these layers can be formed, for example, by epitaxial growth. The n-type compound semiconductor layer 38 is a composition change layer. The n-type compound semiconductor layer (composition change layer) 38 contains a donor impurity. The anode electrode 39 forms a Schottky junction with the top surface of the n-type compound semiconductor layer 38. At parts of the substrate 34, the first buffer layer 35, the second buffer layer 36, and the $n^+$-type compound semiconductor layer 37, a via hole (opening portion to be filled) that extends from the bottom surface (back surface) of the substrate 34 to the lower part of the $n^+$-type compound semiconductor layer 37 is formed. The cathode electrode 33 is formed such that it contacts with the bottom surface of the substrate 34 and fills the via hole (opening portion to be filled). The cathode electrode 33 forms a junction with the $n^+$-type compound semiconductor layer 37 by directly contacting with the $n^+$-type compound semiconductor layer 37. The junction between the cathode electrode 33 and the $n^+$-type compound semiconductor layer 37 is an ohmic contact. The n-type impurity (donor impurity) concentration in the $n^+$-type compound semiconductor layer 37 is set at sufficiently high concentrations so that the contact resistance between the $n^+$-type compound semiconductor layer 37 and the cathode electrode 33 is decreased. The concentration of the donor impurity added to the $n^+$-type compound semiconductor layer 37 is higher than that of the donor impurity added to the n-type compound semiconductor layer 38. In the SBD 2, a voltage can be applied to the n-type compound semiconductor layer (composition change layer) 38 in the direction perpendicular to the principal surface thereof by application of a voltage between the anode electrode 39 and the cathode electrode 33. The n-type compound semiconductor layer (composition change layer) 38 has composition that changes from the cathode electrode 33 side toward the anode electrode 39 side in the direction perpendicular to the principal surface of the n-type compound semiconductor layer (composition change layer) 38. At the time of application of a voltage between the anode electrode 39 and the cathode electrode 33, the n-type compound semiconductor layer (composition change layer) 38 can relieve the electric field concentration by neutralizing a positive charge that is generated due to the donor impurity contained in the n-type compound semiconductor layer (composition change layer) 38 by a negative polarization charge that is generated in the n-type compound semiconductor layer (composition change layer) 38.

The first buffer layer 35 and the second buffer layer 36 each have a function of relieving the lattice constant difference between the substrate 34 and the n$^+$-type compound semiconductor layer 37. Particularly, the second buffer layer 36 has a function of determining the lattice constant of each of the n$^+$-type compound semiconductor layer 37 and the n-type compound semiconductor layer 38, which are crystal-grown over the second buffer layer 36.

As with the n-type compound semiconductor layer 23 of Embodiment 1 (FIG. 1), the n-type compound semiconductor layer (composition change layer) 38 has a composition distribution (graded composition) that changes from the lowest part (cathode electrode 33 side) toward the uppermost part (anode electrode 39 side) in the direction perpendicular to the principal surface of the n-type compound semiconductor layer (composition change layer) 38. The n-type compound semiconductor layer 38 can generate a negative polarization charge therein due to the composition distribution. The n-type compound semiconductor layer 38 can be formed, for example, of $Al_xGa_{1-x}N$ ($0 \le x < 1$) into which a donor impurity such as silicon is introduced in the same manner as in Embodiment 1. This n-type compound semiconductor layer (n-type $Al_xGa_{1-x}N$ layer) 38 has the Al composition ratio of $x=x_0$ ($x_0>0$) at the lowest part and has the Al composition ratio of $x=x_A$ ($x_A \ge 0$) at the uppermost part. In the n-type $Al_xGa_{1-x}N$ layer 38, the Al composition ratio x changes from $x_0$ to $x_A$ from the lowest part (cathode electrode 33 side) toward the uppermost part (anode electrode 39 side) continuously or in a stepwise manner on a molecular layer basis (angstrom order). Further, in the n-type $Al_xGa_{1-x}N$ layer 38, the following equation is satisfied: $x_0 > x_A$. In other words, the Al composition ratio x decreases from the lowest part (cathode electrode 33 side) toward the uppermost part (anode electrode 39 side) of the n-type $Al_xGa_{1-x}N$ layer 38 continuously or in a stepwise manner on a molecular layer basis.

The method of producing the semiconductor device 2 shown in FIG. 5 is not particularly limited and is, for example, as follows. That is, first, a substrate 34 made of SiC or the like is provided. Next, a semiconductor layer having the stacking structure of a III-nitride semiconductor is formed over the substrate 34, for example, by the MBE (the aforementioned semiconductor layer formation step). The formation of the semiconductor layer is performed by allowing the first buffer layer 35 (thickness: 20 nm) made of undoped AlN, the second buffer layer 36 (thickness: 2 μm) made of undoped AlGaN, the compound semiconductor layer 37 (thickness: 500 nm, doping concentration: $3 \times 10^{18}$ cm$^{-3}$, and Al composition ratio: y=0.3) made of n$^+$-type AlGaN, and the compound semiconductor layer 38 (thickness: 1.8 μm and doping concentration: $7.1 \times 10^{16}$ cm$^{-3}$) made of n-type AlGaN to be grown from the substrate 34 side in this order. The n$^+$-type compound semiconductor layer 37 is allowed to be grown such that the Ga surface becomes the top surface.

Here, the n-type compound semiconductor layer 38 is formed (grown) such that it has the Al composition ratio of x=0.3 at the bottom surface and has the Al composition ratio of x=0 at the top surface. The Al composition ratio x is controlled such that it changes from the bottom surface toward the top surface of the n-type compound semiconductor layer 38 continuously or in a stepwise manner on a molecular layer basis (angstrom order).

Next, the electrode junction step is performed. That is, first, the anode electrode 39 is formed over the n-type compound semiconductor layer 38 by vapor deposition of a metal film such as a Ni/Au multilayer film, for example. Further, parts of the substrate 34, the first buffer layer 35, the second buffer layer 36, and the n$^+$-type compound semiconductor layer 37 are removed by etching to form a via hole (opening portion to be filled) that extends from the bottom surface (back surface) of the substrate 34 to the lower part of the n$^+$-type compound semiconductor layer 37. Here, only the parts of the substrate 34, the first buffer layer 35, and the second buffer layer 36 may be removed by etching and the etching may be stopped when the bottom surface of the n$^+$-type compound semiconductor layer 37 is exposed. Further, the cathode electrode 33 is formed on the bottom surface of the substrate 34 and in the via hole by vapor deposition of a metal film such as a Ti/Al multilayer film, for example. The cathode electrode 33 is formed such that it contacts with the n$^+$-type compound semiconductor layer 37. The semiconductor device (SBD) 2 can be produced (made) in this manner.

As with the semiconductor device 1 of Embodiment 1, the semiconductor device 2 of this Embodiment can improve the trade-off between the on-state resistance and the pressure resistance beyond the physical limit. Specifically, also in this Embodiment, for example, the relationships shown in the graphs of FIGS. 2 to 4 are achieved as in Embodiment 1.

That is, as with the semiconductor device (SBD) of Embodiment 1, compared with the semiconductor device (SBD) in which the n-type compound semiconductor layer 38 is replaced with a layer having no composition change, the semiconductor device (SBD) of this Embodiment can decrease the on-state resistance at the same pressure resistance. Further, as in Embodiment 1, when the thickness of the n-type semiconductor layer 38 is the same as that of the layer having no composition change, a higher pressure resistance can be obtained at the same on-state resistance.

As described above, the semiconductor device 2 of the second Embodiment has a composition distribution that changes from the lower part to the upper part of the n-type compound semiconductor layer 38. The n-type compound semiconductor layer 38 has a crystal distortion that changes from the lower part to the upper part due to the foregoing composition distribution, and the distribution of this crystal distortion generates a negative polarization charge in the n-type compound semiconductor layer 38. Therefore, as with the semiconductor device 1 of the first Embodiment, the semiconductor device 2 can improve the trade-off between the on-state resistance and the pressure resistance beyond the physical limit. Further, since the cathode electrode 33 is formed on the bottom surface of the substrate 34 (the back surface side of the semiconductor device 2), a substantial chip area can be decreased.

In the semiconductor device 2 shown in FIG. 5, a conductive substrate (for example, an n-type conductive substrate of high concentration) may be used as a substrate, and the formation of the via hole (opening portion to be filled) may be omitted. In this case, the cathode electrode 33 forms a junction with (is electrically connected to) the n$^+$-type compound semiconductor layer 37 via the conductive substrate 34, the first buffer layer 35, and the second buffer layer 36. In this case, the first buffer layer and the second buffer layer preferably are n-type doping layers of high concentration, for example, from the viewpoint of conductivity.

Embodiment 3

Next, the third Embodiment of the present invention will be described.

Figure 6:
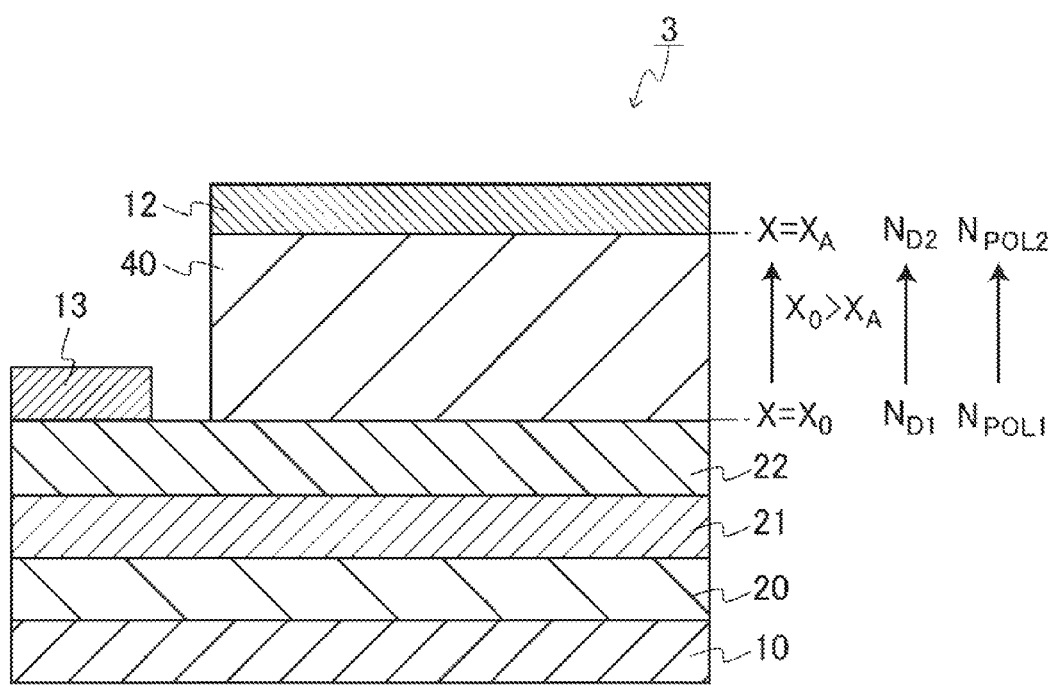
FIG. 6 is a cross sectional view schematically showing the structure of the SBD, which is the semiconductor device of Embodiment 3.

In the cross sectional view of FIG. 6, schematically shown is the structure of the SBD 3, which is the semiconductor device of this Embodiment. As shown in FIG. 6, the semiconductor device (SBD) 3 is the same as the SBD 1 of Embodiment 1 (FIG. 1) except that it includes an n-type compound semiconductor layer (composition change layer) 40 in place of the n-type compound semiconductor layer (composition change layer) 23. The concentration of the donor impurity added to the n⁺-type compound semiconductor layer 22 is higher than that of the donor impurity added to the n-type compound semiconductor layer 40.

The n-type compound semiconductor layer 40 has the composition (composition distribution) that changes from the lowest part (cathode electrode 13 side) toward the uppermost part (anode electrode 12 side) in the direction perpendicular to the principal surface of the n-type compound semiconductor layer (composition change layer) 40. As with the n-type compound semiconductor layer 23 of Embodiment 1 (FIG. 1), the n-type compound semiconductor layer 40 can generate a negative polarization charge therein due to the foregoing composition distribution. The n-type compound semiconductor layer 40 can be formed, for example, of $Al_xGa_{1-x}N$ ($0 \leq x < 1$) to which a donor impurity such as silicon is introduced. As with the n-type compound semiconductor layer 23 of Embodiment 1 (FIG. 1), the Al composition ratio x of the n-type compound semiconductor layer (n-type $Al_xGa_{1-x}N$ layer) 40 decreases from $x_0$ ($x_0 > 0$) to $x_A$ ($x_0 > x_A \geq 0$) from the lowest part (the principal surface at the cathode electrode side, i.e., the interface between the n-type compound semiconductor layer 40 and the n⁺-type compound semiconductor layer 22) toward the uppermost part (the principal surface at the anode electrode side, i.e., the interface between the n-type compound semiconductor layer 40 and the anode electrode 12) continuously or in a stepwise manner on a molecular layer basis. It is to be noted that the Al composition ratio x and the distribution of the donor impurity concentration are different from those of the n-type compound semiconductor layer 23 of Embodiment 1 as follows.

In the n-type compound semiconductor layer 23 of Embodiment 1, the volume density of a negative charge due to polarization is kept constant by changing the increase of the thickness with respect to the Al composition ratio. In contrast, in the n-type compound semiconductor layer 40 of this Embodiment, the change of the thickness is kept constant with respect to the change of the Al composition ratio. In this case, the volume density of a negative charge due to polarization is high at the cathode electrode 13 side and is low at the anode electrode 12 side. In other words, in this Embodiment, the volume density of the polarization charge that is generated in the composition change layer decreases from the cathode electrode side toward the anode electrode side in the direction perpendicular to the principal surface of the composition change layer. In the n-type compound semiconductor layer 40, by giving the distribution (the distribution high at the cathode electrode 13 side and low at the anode electrode 12 side) that is similar to the volume density of a negative charge also to the donor impurity concentration, the donor impurity concentration and the negative charge due to polarization are allowed to be cancelled. In other words, in this Embodiment, the donor impurity concentration in the composition change layer decreases from the cathode electrode side toward the anode electrode side in the direction perpendicular to the principal surface of the composition change layer. In the n-type compound semiconductor layer 40, the donor impurity concentration $N_D$ and the volume density $N_{POL}$ of the negative charge are equal ($N_D = N_{POL}$) over the entire structure. Here, as shown in FIG. 6, in the n-type compound semiconductor layer 40, the volume density of the negative charge at the lowest part (the principal surface at the cathode electrode side, i.e., the interface between the n-type compound semiconductor layer 40 and the n⁺-type compound semiconductor layer 22) is defined $N_{POL1}$ and the volume density of the negative charge at the uppermost part (the principal surface at the anode electrode side, i.e., the interface between the n-type compound semiconductor layer 40 and the anode electrode 12) is defined as $N_{POL2}$. Further, in the n-type compound semiconductor layer 40, the donor impurity concentration at the lowest part (the principal surface at the cathode electrode side, i.e., the interface between the n-type compound semiconductor layer 40 and the n⁺-type compound semiconductor layer 22) is defined as $N_{D1}$ and the donor impurity concentration at the uppermost part (the principal surface at the anode electrode side, i.e., the interface between the n-type compound semiconductor layer 40 and the anode electrode 12) is defined as $N_{D2}$.

In the n-type compound semiconductor layer 40 of this Embodiment, in this manner, by perfectly matching the distribution of the volume density of the polarization negative charge (negative polarization charge) with the distribution of the donor impurity concentration, the electric field at the time of application of the reverse direction bias can achieve the distribution similar to that of the intrinsic semiconductor. Thereby, the positive charge generated at the time of application of the reverse direction bias can be cancelled by the negative polarization charge. Therefore, as with the semiconductor device (SBD) 1 of Embodiment 1, the semiconductor device (SBD) 3 of this Embodiment can improve the trade-off between the on-state resistance and the pressure resistance beyond the physical limit.

The method of producing the semiconductor device 3 shown in FIG. 6 is not particularly limited. For example, the semiconductor device 3 may be produced in the same manner as in Embodiment 1 except that the n-type compound semiconductor layer (composition change layer) 40 is formed in place of the n-type compound semiconductor layer (composition change layer) 23. More specifically, for example, the semiconductor device 3 can be produced according to the Examples that will be described below.

As with the semiconductor device (SBD) of Embodiment 1, compared with the semiconductor device (SBD) in which the n-type compound semiconductor layer 40 is replaced with a layer having no composition change, the semiconductor device (SBD) of this Embodiment can decrease the on-state resistance at the same pressure resistance. Further, as in Embodiment 1, when the thickness of the n-type semiconductor layer 40 is the same as that of the layer having no composition change, a higher pressure resistance can be obtained at the same on-state resistance.

Embodiment 4

Next, the fourth Embodiment of the present invention will be described.

Figure 7:
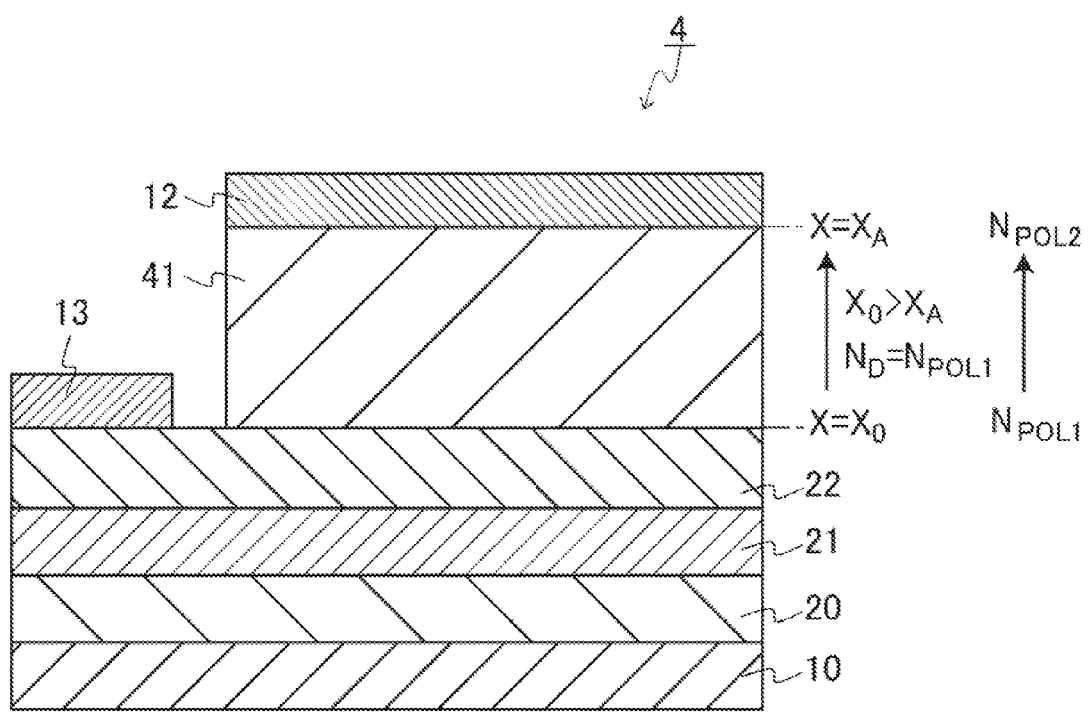
FIG. 7 is a cross sectional view schematically showing the structure of the SBD, which is the semiconductor device of Embodiment 4.

In the cross sectional view of FIG. 7, schematically shown is the structure of the SBD 4, which is the semiconductor device of this Embodiment. As shown in FIG. 7, the semiconductor device (SBD) 4 is the same as the SBD 1 of Embodiment 1 (FIG. 1) except that it includes an n-type compound semiconductor layer (composition change layer) 41 in place of the n-type compound semiconductor layer (composition change layer) 23. The concentration of the donor impurity added to the n⁺-type compound semiconductor layer 22 is higher than that of the donor impurity added to the n-type compound semiconductor layer 41.

The n-type compound semiconductor layer 41 has the composition (composition distribution) that changes from the lowest part (cathode electrode 13 side) toward the uppermost part (anode electrode 12 side) in the direction perpendicular to the principal surface of the n-type compound semiconductor layer (composition change layer) 41. As with the n-type compound semiconductor layer 23 of Embodiment 1 (FIG. 1), the n-type compound semiconductor layer 41 can generate a negative polarization charge therein due to the foregoing composition distribution. The n-type compound semiconductor layer 41 can be formed, for example, of $Al_xGa_{1-x}N$ ($0 \leq x < 1$) to which a donor impurity such as silicon is introduced. As with the n-type compound semiconductor layer 23 of Embodiment 1 (FIG. 1) and the n-type compound semiconductor layer 40 of Embodiment 3 (FIG. 6), the Al composition ratio x of the n-type compound semiconductor layer (n-type $Al_xGa_{1-x}N$ layer) 41 decreases from $x_0$ ($x_0 > 0$) to $x_A$ ($x_0 > x_A \geq 0$) from the lowest part (the principal surface at the cathode electrode side, i.e., the interface between the n-type compound semiconductor layer 41 and the n⁺-type compound semiconductor layer 22) toward the uppermost part (the principal surface at the anode electrode side, i.e., the interface between the n-type compound semiconductor layer 41 and the anode electrode 12) continuously or in a stepwise manner on a molecular layer basis. It is to be noted that the Al composition ratio x and the distribution of the donor impurity concentration are different from those in Embodiments 1 and 3 as follows.

In the n-type compound semiconductor layer 23 of Embodiment 1, the volume density of a negative charge due to polarization (negative polarization charge) is kept constant by changing the increase of the thickness with respect to the Al composition ratio. In contrast, in the n-type compound semiconductor layer 41 of this Embodiment, as with the n-type compound semiconductor layer 40 of Embodiment 3, the change of the thickness is kept constant with respect to the change of the Al composition ratio. In this case, the volume density of a negative charge due to polarization is high at the cathode electrode 13 side and is low at the anode electrode 12 side. In other words, in this Embodiment, the volume density of the polarization charge that is generated in the composition change layer by application of a voltage between the anode electrode and the cathode electrode decreases from the cathode electrode side toward the anode electrode side in the direction perpendicular to the principal surface of the composition change layer. Further, in the n-type compound semiconductor layer 40 of Embodiment 3, the distribution similar to the foregoing distribution is given to the donor impurity concentration. In contrast, in the n-type compound semiconductor layer 41 of this Embodiment, the donor impurity concentration has the distribution that is uniform over the entire structure. In other words, in this Embodiment, the donor impurity concentration in the composition change layer is uniform over the entire n-type compound semiconductor layer 41. Here, as shown in FIG. 7, in the n-type compound semiconductor layer 41, the volume density of the negative charge at the lowest part (the principal surface at the cathode electrode side, i.e., the interface between the n-type compound semiconductor layer 41 and the n⁺-type compound semiconductor layer 22) is defined as $N_{POL1}$ and the volume density of the negative charge at the uppermost part (the principal surface at the anode electrode side, i.e., the interface between the n-type compound semiconductor layer 41 and the anode electrode 12) is defined as $N_{POL2}$. Further, in the n-type compound semiconductor layer 41, the donor impurity concentration $N_D$ is uniform over the entire n-type compound semiconductor layer 41, and it can be expressed by the following equation: $N_D = N_{POL1}$.

In the semiconductor device (SBD) of this Embodiment, since the n-type compound semiconductor layer 41 has the foregoing configuration, a positive charge that is generated in the n-type compound semiconductor layer 41 at the time of application of the reverse direction bias can be cancelled by the negative polarization charge. Therefore, the semiconductor device (SBD) of this Embodiment can improve the trade-off between the on-state resistance and the pressure resistance beyond the physical limit.

Figure 8:
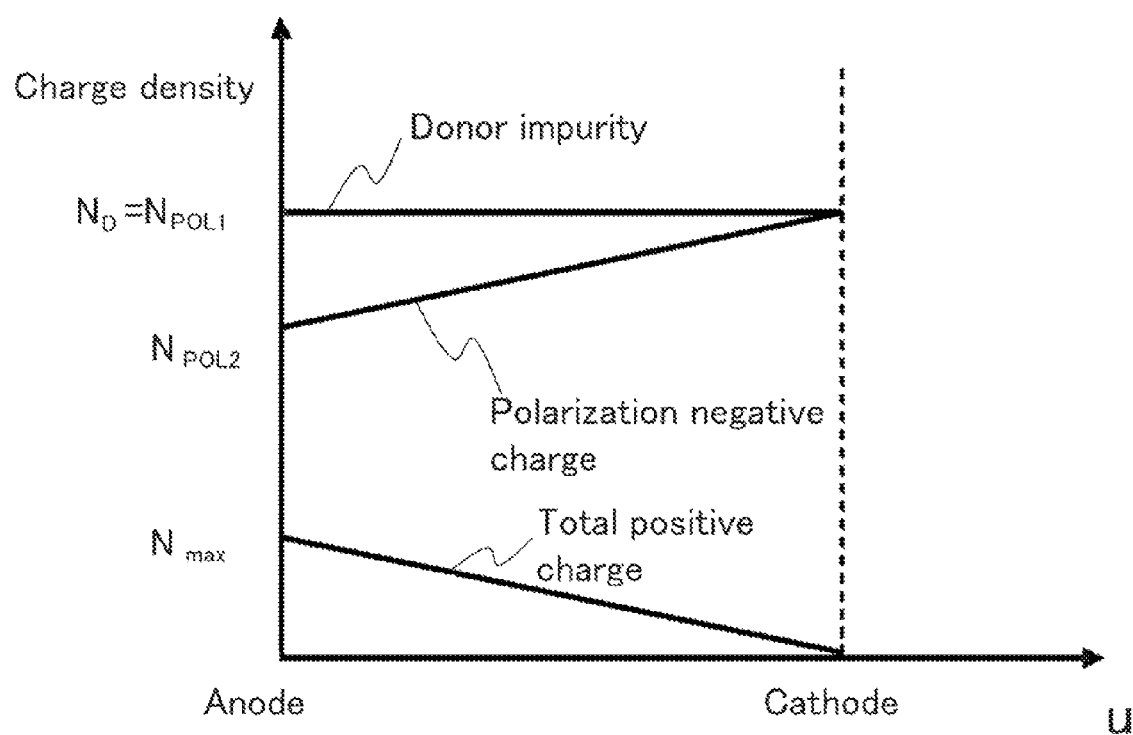
FIG. 8 is a graph schematically illustrating the distribution of the charge density in the semiconductor device of Embodiment 4.

In the graph of FIG. 8, schematically shown is the distribution of the charge density of the n-type $Al_xGa_{1-x}N$ layer 41. In FIG. 8, the vertical axis shows the density of the negative charge and the positive charge (total positive charge) and the horizontal axis shows a position u from the anode electrode side to the cathode electrode side in the direction perpendicular to the substrate plane. As shown in FIG. 8, when the donor impurity concentration is defined as $N_D$, the negative charge density at the cathode electrode side is defined as $N_{POL1}$, and the negative charge density of the anode electrode side is defined as $N_{POL2}$, the following equations are satisfied: $N_D = N_{POL1}$ and $N_{POL1} > N_{POL2}$. The total positive charge of the n-type $Al_xGa_{1-x}N$ layer 41 shows the highest value $N_{MAX}$ at the uppermost part (the principal surface at the anode electrode side, i.e., the interface between the n-type $Al_xGa_{1-x}N$ layer 41 and the anode electrode 12) and shows 0 at the lowest part (the principal surface at the cathode electrode side, i.e., the interface between the n-type $Al_xGa_{1-x}N$ layer 41 and the n⁺-type compound semiconductor layer 22). When the change of the composition with respect to the position u is a constant value β, the distribution of the polarization charge density can be expressed by the following mathematical equation (22).

[Mathematical Equation 22]

$$\frac{\sigma(u)}{q} = N_{max} - \beta u \qquad (22)$$

Since the charge at the depletion layer end is 0, the depletion layer width W (m) is given by the following mathematical equation (23).

[Mathematical Equation 23]

$$W = \frac{N_{max}}{\beta} \qquad (23)$$

Further, since the charge at the depletion layer end is 0, when the mathematical equation (22) is integrated with respect to u, the following mathematical equation (24) can be derived with respect to the electric field intensity E (V/m) of the n-type compound semiconductor layer 41.

[Mathematical Equation 24]

$$E = -\frac{q\beta}{2\varepsilon_s}u^2 + \frac{qN_{max}}{\varepsilon_s}u - \frac{qN_{max}^2}{2\varepsilon_s} \quad (24)$$

Since the electric field intensity shows a maximal value at u=0, the following mathematical equation (25) is given.

[Mathematical Equation 25]

$$E_{max} = \frac{qN_{max}^2}{2\varepsilon_s} \quad (25)$$

Here, the $E_{max}$ (V/m) is the absolute value of the electric field intensity E of the case where u=0 in the mathematical equation (24). The following mathematical equation (26) can be derived by integrating the mathematical equation (24) with respect to u on the assumption that the following conditions are satisfied: V=0 at the depletion layer end and V=$V_B$ at u=0.

[Mathematical Equation 26]

$$V_B = \frac{10\varepsilon_s E_{crit}^2}{3qN_{max}} \quad (26)$$

Based on the mathematical equations (6), (23), and (25), the following mathematical equation (27) holds.

[Mathematical Equation 27]

$$R_{on} = \frac{2\varepsilon_s E_{crit}}{qN_{max}N_D\mu} \quad (27)$$

Figure 9:
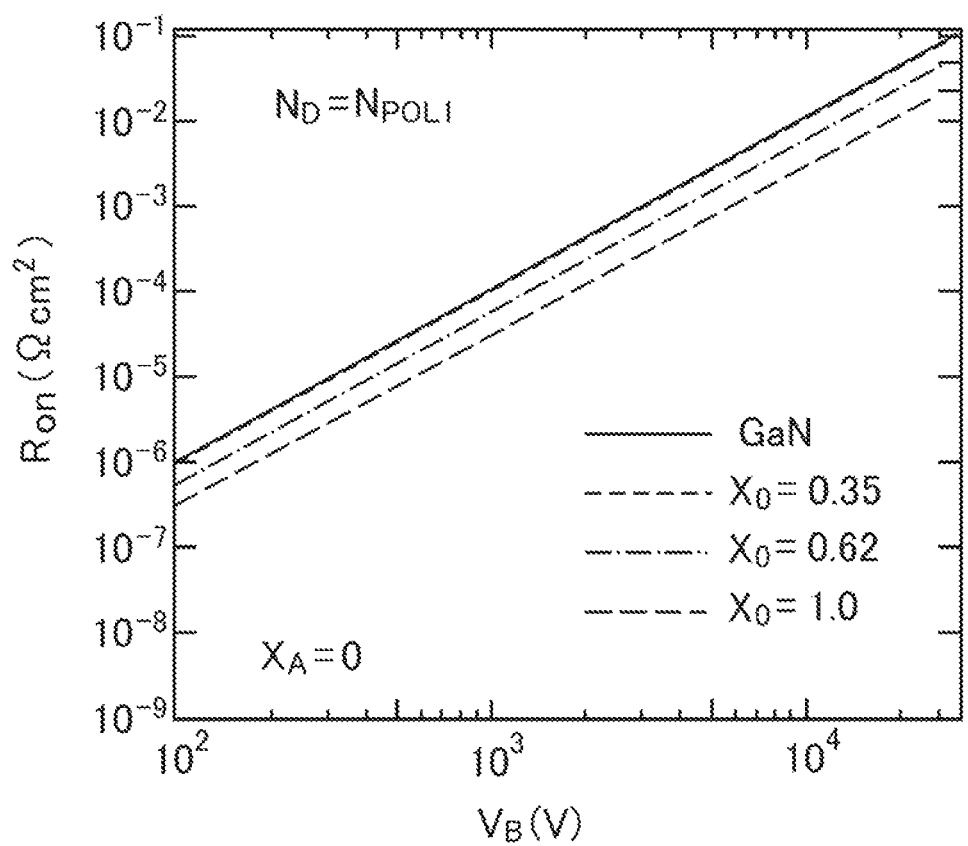
FIG. 9 is a graph plotting an illustration of the relationship between the on-state resistance and the pressure resistance in the semiconductor device of Embodiment 4.

In the graph of FIG. 9, the relationship between the on-state resistance and the pressure resistance of the n-type $Al_xGa_{1-x}N$ layer 41 is plotted on the basis of the mathematical equations (26) and (27). In FIG. 9, the vertical axis shows the on-state resistance $R_{on}$ and the horizontal axis shows the pressure resistance $V_B$. In FIG. 9, three dashed lines show plots of the cases in which x of the $Al_xGa_{1-x}N$ layer 41 is continuously decreased from the values of $x_0$ (0.35, 0.62, and 1.0) shown in FIG. 4 to $x_A$=0 in the SBD of this Embodiment. The solid line shows a plot of the SBD in which the composition ratio of the $Al_xGa_{1-x}N$ layer 41 is constant at x=0 (i.e., the $Al_xGa_{1-x}N$ layer 41 is a GaN layer). As shown in FIG. 9, in the SBD of this Embodiment in which the composition is changed from $x_0$=0.35 to $x_A$=0, compared with the SBD including a GaN layer (not having a composition change layer), the on-state resistance at the same pressure resistance is slightly decreased. The on-state resistance can be decreased to ½ of the GaN layer by further increasing the polarization charge with $x_0$=0.62 and can be decreased to ¼ of the GaN layer by generating a maximum polarization charge in this system with $x_0$=1.0. This tells that the SBD of this Embodiment can greatly decrease the on-state resistance at the same pressure resistance as compared to the SBD that does not have the composition change layer.

The method of producing the semiconductor device 4 shown in FIG. 7 is not particularly limited. For example, the semiconductor device 4 may be produced in the same manner as in Embodiment 1 except that the n-type compound semiconductor layer (composition change layer) 41 is formed in place of the n-type compound semiconductor layer (composition change layer) 23. More specifically, for example, the semiconductor device 4 can be produced according to the Examples that will be described below.

As with the semiconductor device (SBD) of Embodiment 1, compared with the semiconductor device (SBD) in which the n-type compound semiconductor layer 41 is replaced with a layer having no composition change, the semiconductor device (SBD) of this Embodiment can decrease the on-state resistance at the same pressure resistance. Further, as in Embodiment 1, when the thickness of the n-type semiconductor layer 41 is the same as that of the layer having no composition change, a higher pressure resistance can be obtained at the same on-state resistance.

Embodiment 5

Next, the fifth Embodiment of the present invention will be described.

Figure 10:
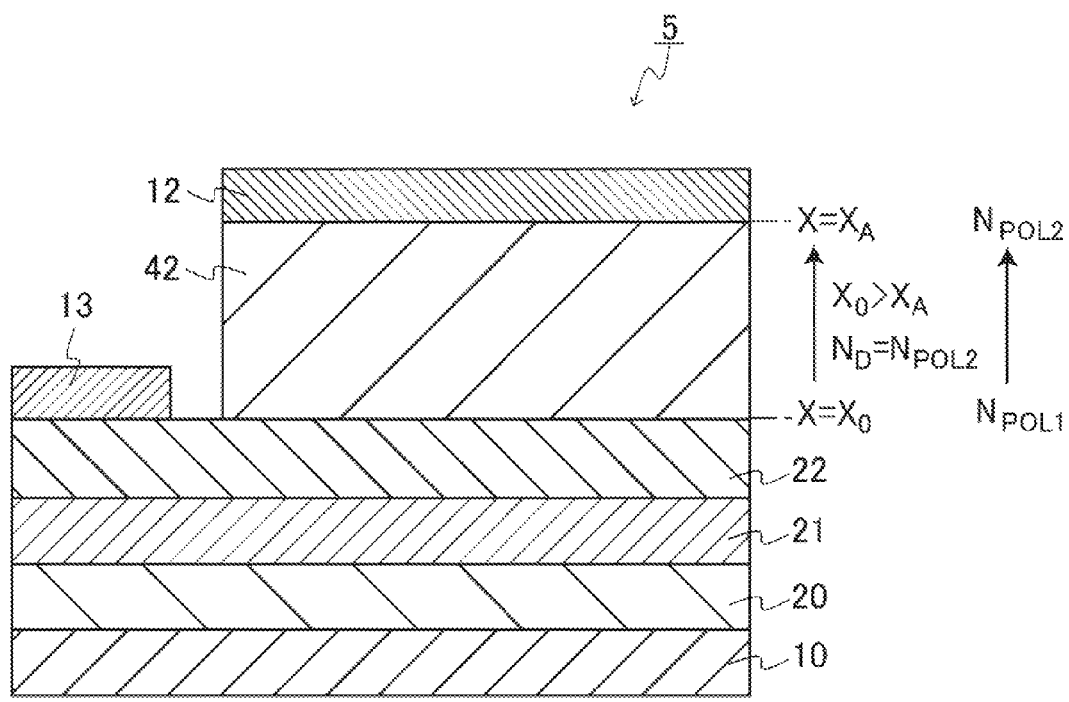
FIG. 10 is a view schematically showing the cross sectional structure of the SBD, which is the semiconductor device of Embodiment 5.

In the cross sectional view of FIG. 10, schematically shown is the structure of the SBD 5, which is the semiconductor device of this Embodiment. As shown in FIG. 10, the semiconductor device (SBD) 5 is the same as the SBD 1 of Embodiment 1 (FIG. 1) except that it includes an n-type compound semiconductor layer (composition change layer) 42 in place of the n-type compound semiconductor layer (composition change layer) 23. The concentration of the donor impurity added to the n$^+$-type compound semiconductor layer 22 is higher than that of the donor impurity added to the n-type compound semiconductor layer 42.

The n-type compound semiconductor layer 42 has the composition (composition distribution) that changes from the lowest part (cathode electrode 13 side) toward the uppermost part (anode electrode 12 side) in the direction perpendicular to the principal surface of the n-type compound semiconductor layer (composition change layer) 42. As with the n-type compound semiconductor layer 23 of Embodiment 1 (FIG. 1), the n-type compound semiconductor layer 42 can generate a negative polarization charge therein due to the foregoing composition distribution. The n-type compound semiconductor layer 42 can be formed, for example, of $Al_xGa_{1-x}N$ (0≤x<1) to which a donor impurity such as silicon is introduced. As with the n-type compound semiconductor layer 23 of Embodiment 1 (FIG. 1) and the n-type compound semiconductor layer 41 of Embodiment 4 (FIG. 7), the Al composition ratio x of the n-type compound semiconductor layer (n-type $Al_xGa_{1-x}N$ layer) 42 decreases from $x_0$ ($x_0$>0) to $x_A$ ($x_A$≥0) from the lowest part (the principal surface at the cathode electrode side, i.e., the interface between the n-type compound semiconductor layer 42 and the n$^+$-type compound semiconductor layer 22) toward the uppermost part (the principal surface at the anode electrode side, i.e., the interface between the n-type compound semiconductor layer 42 and the anode electrode 12) continuously or in a stepwise manner on a molecular layer basis. It is to be noted that the donor impurity concentration is different from that in Embodiment 4. In other words, in the n-type compound semiconductor layer 41 of Embodiment 4, the donor impurity concentration $N_D$ is equal to the volume density $N_{POL1}$ of the negative charge at the cathode side (the principal surface at the cathode electrode side, i.e., the interface between the n-type compound semiconductor layer 41 and the n$^+$-type compound semiconductor layer 22). In contrast, in the n-type compound semiconductor layer 42 of this Embodiment, the donor impurity concentration $N_D$ is equal to the volume density $N_{POL2}$ of the negative charge at the anode side (the principal surface at the anode electrode side, i.e., the interface between the n-type compound semiconductor layer 42 and the anode electrode 12), and is uniform over the entire n-type compound semiconductor layer 42. Except for this, the n-type compound semiconductor layer 42 is the same as the n-type compound semiconductor layer 41 of Embodiment 4.

Figure 11:
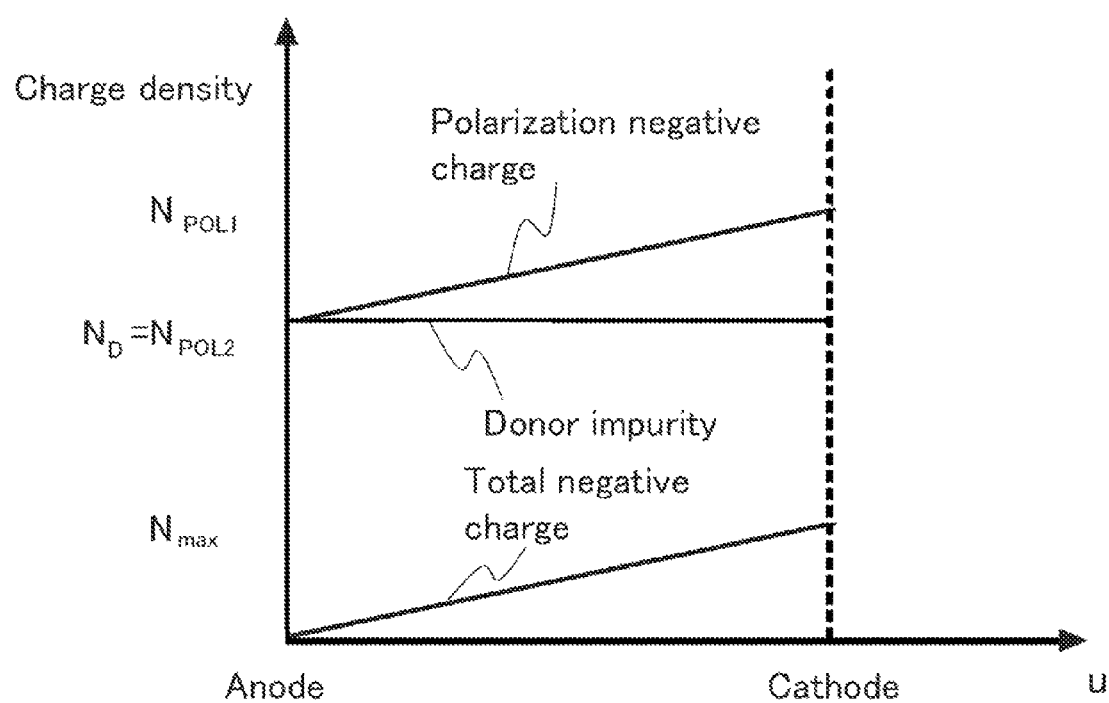
FIG. 11 is a graph schematically showing the distribution of the charge density in the semiconductor device of Embodiment 5.

In the graph of FIG. 11, schematically illustrated is the distribution of the charge density of the n-type $Al_xGa_{1-x}N$ layer 42. In FIG. 11, the vertical axis shows the density of the polarization negative charge (negative polarization charge) and the density of the positive charge (total positive charge) of the n-type $Al_xGa_{1-x}N$ layer 42 and the horizontal axis shows a position u from the anode electrode side (the principal surface at the anode electrode side) to the cathode electrode side (the principal surface at the cathode electrode side) in the direction perpendicular to the substrate plane. As shown in FIG. 11, when the negative charge density at the principal surface at the cathode electrode side is defined as $N_{POL1}$ and the negative charge density at the principal surface at the anode electrode side is defined as $N_{POL2}$, the following equations are satisfied: $N_D=N_{POL2}$ and $N_{POL2}>N_{POL1}$. The total negative charge shows the lowest value 0 at the principal surface at the anode electrode side and shows the highest value $N_{max}$ at the principal surface at the cathode electrode side. The n-type $Al_xGa_{1-x}N$ layer 42 of this Embodiment is different from the n-type compound semiconductor layer 41 of Embodiment 4 in that the peak of the electric field is present at the cathode electrode side and that the doping concentration (carrier concentration) at the cathode electrode side is equal to that of the anode electrode side ($N_D=N_{POL2}$) and therefore is lower than that in Embodiment 4. Therefore, in this Embodiment, the negative charge due to the polarization remains in the n-type $Al_xGa_{1-x}N$ layer 42. However, since this Embodiment is the same as Embodiment 4 except that the positive and the negative of the charge of the n-type $Al_xGa_{1-x}N$ layer are inverted, the relationship between the on-state resistance and the pressure resistance of the SBD in this Embodiment is nearly the same as that in Embodiment 4.

Further, in Embodiment 4 and this Embodiment, described are the examples in which the donor impurity concentration $N_D$ agrees with a maximum value or a minimum value of the polarization negative charge density. However, the trade-off between the on-state resistance and the pressure resistance can also be improved beyond the physical limit also by equalizing the $N_D$ to an arbitrary value between the maximum value and the minimum value.

The method of producing the semiconductor device 5 shown in FIG. 10 is not particularly limited. For example, the semiconductor device 5 may be produced in the same manner as in Embodiment 1 except that the n-type compound semiconductor layer (composition change layer) 42 is formed in place of the n-type compound semiconductor layer (composition change layer) 23. More specifically, for example, the semiconductor device 5 can be produced according to the Examples that will be described below.

As with the semiconductor device (SBD) of Embodiment 1, compared with the semiconductor device (SBD) in which the n-type compound semiconductor layer 42 is replaced with a layer having no composition change, the semiconductor device (SBD) of this Embodiment can decrease the on-state resistance at the same pressure resistance. Further, as in Embodiment 1, when the thickness of the n-type semiconductor layer 42 is the same as that of the layer having no composition change, a higher pressure resistance can be obtained at the same on-state resistance.

Embodiment 6

Next, the sixth Embodiment of the present invention will be described.

Figure 12:
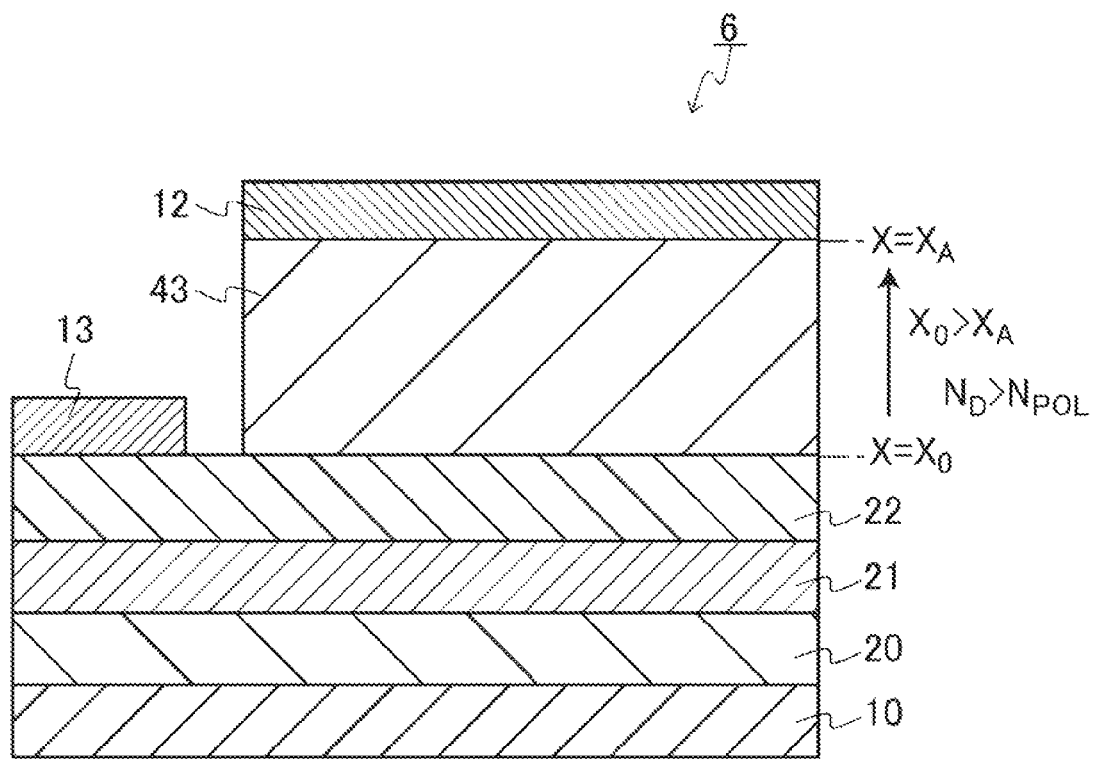
FIG. 12 is a view schematically showing the cross sectional structure of the SBD, which is the semiconductor device of Embodiment 6.

In the cross sectional view of FIG. 12, schematically shown is the structure of the SBD 6, which is the semiconductor device of this Embodiment. As shown in FIG. 12, the semiconductor device (SBD) 6 is the same as the SBD 1 of Embodiment 1 (FIG. 1) except that it includes an n-type compound semiconductor layer (composition change layer) 43 in place of the n-type compound semiconductor layer (composition change layer) 23. The concentration of the donor impurity added to the n⁺-type compound semiconductor layer 22 is higher than that of the donor impurity added to the n-type compound semiconductor layer 43.

The n-type compound semiconductor layer 43 has the composition (composition distribution) that changes from the lowest part (cathode electrode 13 side) toward the uppermost part (anode electrode 12 side) in the direction perpendicular to the principal surface of the n-type compound semiconductor layer (composition change layer) 43. As with the n-type compound semiconductor layer 23 of Embodiment 1 (FIG. 1), the n-type compound semiconductor layer 43 can generate a negative polarization charge therein due to the foregoing composition distribution. The n-type compound semiconductor layer 43 can be formed, for example, of $Al_xGa_{1-x}N$ ($0 \leq x < 1$) to which a donor impurity such as silicon is introduced. As with the n-type $Al_xGa_{1-x}N$ layers of the aforementioned Embodiments, the Al composition ratio x of the n-type compound semiconductor layer (n-type $Al_xGa_{1-x}N$ layer) 43 decreases from $x_0$ ($x_0 > 0$) to $x_4$ ($x_4 \geq 0$) from the lowest part (the principal surface at the cathode electrode side, i.e., the interface between the n-type compound semiconductor layer 43 and the n⁺-type compound semiconductor layer 22) toward the uppermost part (the principal surface at the anode electrode side, i.e., the interface between the n-type compound semiconductor layer 43 and the anode electrode 12) continuously or in a stepwise manner on a molecular layer basis. It is to be noted that this Embodiment is different from the aforementioned Embodiments in the following points.

In the SBDs 1 and 2 shown in Embodiments 1 and 2, the positive charge due to the donor impurity is completely cancelled by the negative charge due to the polarization charge. Although this configuration is most effective for improving the trade-off between the on-state resistance and the pressure resistance, in order to perform crystal growth by controlling the donor impurity concentration, the Al composition ratio, and the growth rate at the same time, a high level of the control technique is required. Even when the donor impurity concentration does not completely agree with the polarization charge density, if the positive charge at the time of application of the reverse direction bias is decreased by the negative charge due to polarization, the effect of increasing the pressure resistance can be achieved. This will be described as follows.

In the SBD 6 of this Embodiment, as shown in FIG. 12, the donor impurity concentration NI) is larger than the polarization negative charge density $N_{POL}$ over the entire n-type compound semiconductor layer (composition change layer) 43. In the SBD 6, the pressure resistance $V_B$ (V) is given by the following mathematical equation (4B) by modifying the mathematical equation (4).

[Mathematical Equation 28]

$$V_B = \frac{\varepsilon_s E_{crit}^2}{2q(N_D - N_{POL})} - V_{bi} + \frac{kT}{q} \quad (4B)$$

The on-state resistance $R_{on}$ ($\Omega \cdot m^2$) at this time can be expressed by the following mathematical equation (6B) based on the mathematical equation (6).

[Mathematical Equation 29]

$$R_{on} = \frac{d_{min}}{qN_D\mu} \quad (6B)$$

Here, the thickness $d_{min}$ (m) of the n-type $Al_xGa_{1-x}N$ layer 43 is given by the following mathematical equation (5B).

[Mathematical Equation 30]

$$d_{min} = \frac{\varepsilon_s E_{crit}}{q(N_D - N_{POL})} \quad (5B)$$

Figure 13:
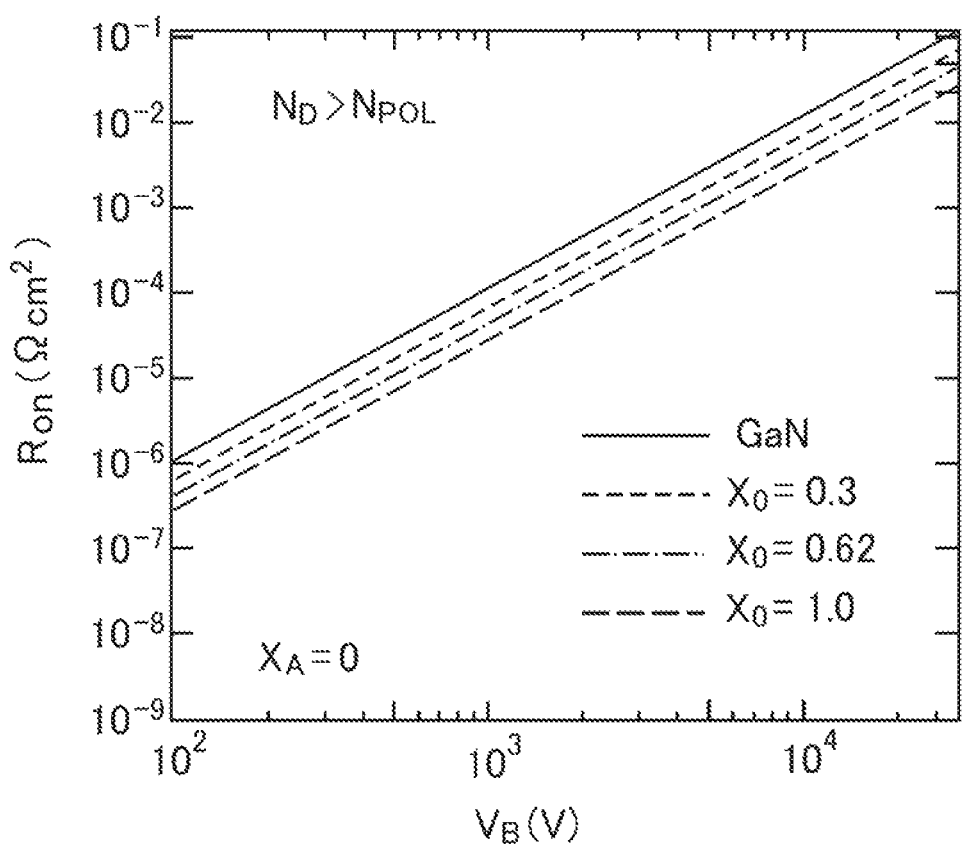
FIG. 13 is a graph plotting an illustration of the relationship between the on-state resistance and the pressure resistance in the semiconductor device of Embodiment 6.

In the graph of FIG. 13, shown is a result obtained by plotting the relationship between the on-state resistance and the pressure resistance on the basis of the mathematical equations (4B), (6B), and (5B). In FIG. 4, the vertical axis shows the on-state resistance $R_{on}$ ($\Omega \cdot m^2$) and the horizontal axis shows the pressure resistance $V_B$ (V). In FIG. 13, three dashed lines show plots of the cases in which x of the $Al_xGa_{1-x}N$ layer 43 is continuously decreased from the values of $x_0$ (0.3, 0.62, and 1.0) shown in FIG. 4 to $x_A=0$ in the SBD of this Embodiment. The solid line shows a plot of the SBD in which the composition ratio of the $Al_xGa_{1-x}N$ layer 43 is constant at x=0 (i.e., the $Al_xGa_{1-x}N$ layer 43 is a GaN layer). As shown in FIG. 13, compared with the SBD including a GaN layer (not having a composition change layer) indicated by the solid line, the SBD of this Embodiment having the composition that changes from $x_0=0.3$ to $x_A=0$ can decrease the on-state resistance to about 60% at the same pressure resistance. The on-state resistance can be decreased to 40% of the SBD including the GaN layer by further increasing the polarization charge with $x_0=0.62$. Further, the on-state resistance can be decreased to ¼ of the SBD including the GaN layer by generating a maximum polarization charge in this system with $x_0=1.0$. On the basis of the mathematical equations (4B), (6B), and (5B), the ratio of the donor impurity concentration to the volume density of the polarization charge with which the on-state resistance shows the lowest value can be obtained. In other words, according to the mathematical equations (4B), (6B), and (5B), with respect to the semiconductor device that does not include the composition change layer, the on-state resistance of the semiconductor device of the present invention can be decreased, for example, by 20% if the donor impurity concentration is about 5 times the polarization charge density in the composition change layer. Similarly, the on-state resistance can be decreased, for example, by 40% if the donor impurity concentration is about 2.5 times the polarization charge density in the composition change layer. From this reason, in the present invention, it is preferable that the donor impurity concentration ($m^{-3}$) of the composition change layer is not more than 5 times the maximum value $N_{POL}^{MAX}$ ($m^{-3}$) of the volume density of the polarization charge that can be generated in the composition change layer. Further, it is more preferable that the donor impurity concentration ($m^{-3}$) of the composition change layer is not more than 2.5 times the maximum value $N_{POL}^{MAX}$ ($m^{-3}$) of the volume density of the polarization charge that can be generated in the composition change layer. Ideally, the donor impurity concentration ($m^{-3}$) of the composition change layer is equal to the maximum value $N_{POL}^{MAX}$ ($m^{-3}$) of the volume density of the polarization charge that can be generated in the second n-type semiconductor layer.

The method of producing the semiconductor device 6 shown in FIG. 12 is not particularly limited. For example, the semiconductor device 6 may be produced in the same manner as in Embodiment 1 except that the n-type compound semiconductor layer (composition change layer) 43 is formed in place of the n-type compound semiconductor layer (composition change layer) 23. More specifically, for example, the semiconductor device 6 can be produced according to the Examples that will be described below.

As with the semiconductor device (SBD) of Embodiment 1, compared with the semiconductor device (SBD) in which the n-type compound semiconductor layer 43 is replaced with a layer having no composition change, the semiconductor device (SBD) of this Embodiment can decrease the on-state resistance at the same pressure resistance. Further, as in Embodiment 1, when the thickness of the n-type semiconductor layer 43 is the same as that of the layer having no composition change, a higher pressure resistance can be obtained at the same on-state resistance. In FIG. 12 and the description thereof, illustrated is a semiconductor device (SBD) in which the polarization charge density $N_{POL}$ is uniform over the entire composition change layer as with Embodiment 1. However, this Embodiment is not limited thereto, and the trade-off between the on-state resistance and the pressure resistance can be improved according to the mathematical equations (4B) to (6B) if the donor impurity concentration $N_D$ is larger than the polarization negative charge density $N_{POL}$ over the entire composition change layer. Specifically, for example, the composition change layer may have the polarization charge density that changes in the same manner as in Embodiments 3 to 5.

Embodiment 7

Next, the seventh Embodiment of the present invention will be described.

Figure 14:
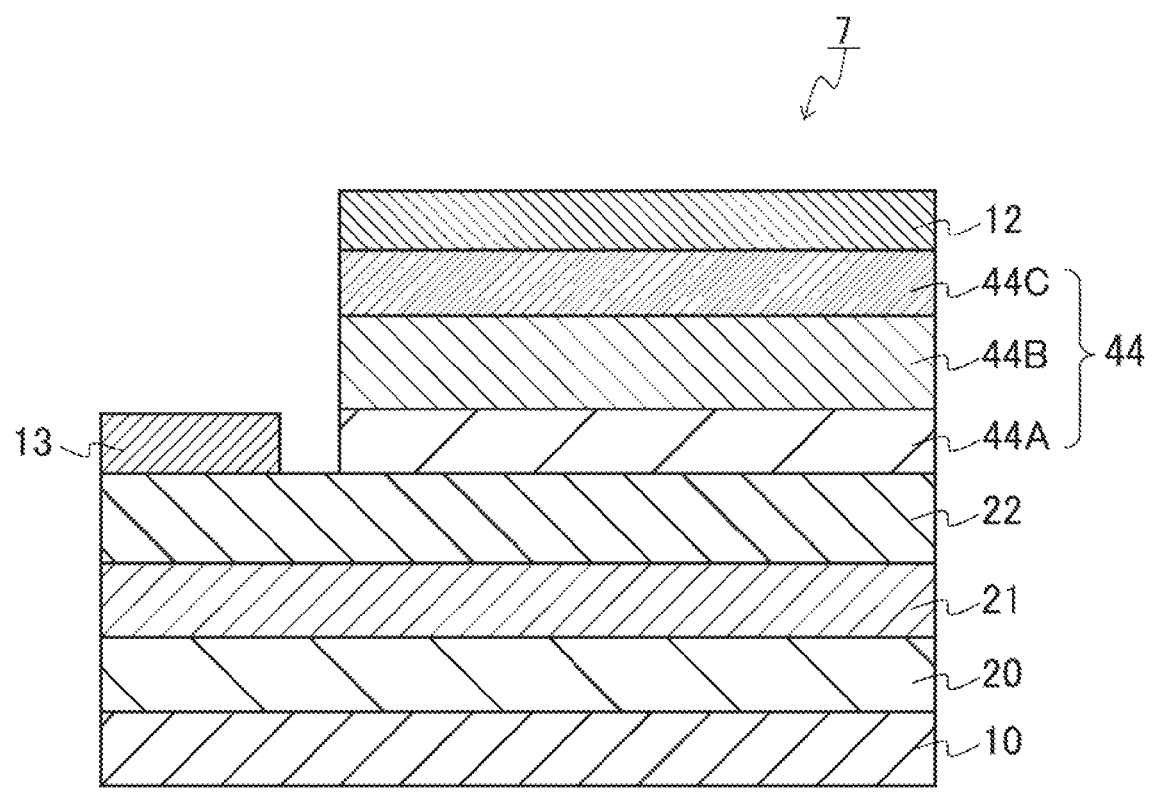
FIG. 14 is a view schematically showing the cross sectional structure of the SBD, which is the semiconductor device of Embodiment 7.

In the cross sectional view of FIG. 14, schematically shown is the structure of the SBD 7, which is the semiconductor device of this Embodiment. As shown in FIG. 14, the semiconductor device (SBD) 7 is the same as the SBD 1 of Embodiment 1 (FIG. 1) except that it includes an n-type compound semiconductor layer (composition change layer) 44 in place of the n-type compound semiconductor layer (composition change layer) 23. The concentration of the donor impurity added to the $n^+$-type compound semiconductor layer 22 is higher than that of the donor impurity added to the n-type compound semiconductor layer 44.

The n-type compound semiconductor layer (composition change layer) 44 has the multilayer structure including a first semiconductor layer 44A, a second semiconductor layer 44B, and a third semiconductor layer 44C. A donor impurity such as silicon is introduced into the multilayer structure. The first semiconductor layer 44A is made of $Al_xGa_{1-x}N$ ($0 \leq x < 1$), the second semiconductor layer 44B is made of $Al_zGa_{1-z}N$ ($0 \leq z < 1$), and the third semiconductor layer 44C is made of $Al_wGa_{1-w}N$ (0≤w<1). In this Embodiment, the Al composition ratios x, z, and w are constant. In other words, the Al composition ratio of each of the first semiconductor layer 44A, the second semiconductor layer 44B, and the third semiconductor layer 44C is uniform. Further, with respect to the Al composition ratios x, z, and w, the following relational equation shall be held: x>z>w. Therefore, in the n-type compound semiconductor layer (composition change layer) 44, the Al composition ratio changes from the cathode electrode 13 side toward the anode electrode 12 side in three stages. It is not limited that the Al composition ratio of the n-type compound semiconductor layer (composition change layer) 44 changes in three stages, and the Al composition ratio may be changed in arbitrary L stages (L is 2 or an integer of 4 or more).

For example, the Al composition ratio of the $n^+$-type compound semiconductor layer 22 shall satisfy y=0.3, the Al composition ratio of the first semiconductor layer 44A shall satisfy x=0.2, the Al composition ratio of the second semiconductor layer 44B shall satisfy z=0.1, and the Al composition ratio of the third semiconductor layer 44C shall satisfy w=0. Here, the differences of charges among the layers in the n-type compound semiconductor layer 44 can be calculated as $4.74 \times 10^{12}$ cm$^{-2}$, $4.25 \times 10^{12}$ cm$^{-2}$, and $3.78 \times 10^{12}$ cm$^{-2}$ based on the mathematical equation (13). Since these charges are unevenly distributed at the interfaces of the layers, the positive charge due to the donor impurity remains at the time of the application of the reverse direction bias. Such an SBD of this Embodiment shows a comparable performance to the SBD of Embodiment 6 in that the trade-off between the on-state resistance and the pressure resistance can be improved beyond the physical limit.

The method of producing the semiconductor device 7 shown in FIG. 14 is not particularly limited. For example, the semiconductor device 7 may be produced in the same manner as in Embodiment 1 except that the n-type compound semiconductor layer (composition change layer) 44 is formed in place of the n-type compound semiconductor layer (composition change layer) 23. More specifically, for example, the semiconductor device 7 can be produced according to the Examples that will be described below.

As with the semiconductor device (SBD) of Embodiment 1, compared with the semiconductor device (SBD) in which the n-type compound semiconductor layer 44 is replaced with a layer having no composition change, the semiconductor device (SBD) of this Embodiment can decrease the on-state resistance at the same pressure resistance. On the other hand, when the thickness of the n-type semiconductor layer 44 is the same as that of the layer having no composition change, a higher pressure resistance can be obtained at the same on-state resistance. Specifically, it is the same as in Embodiment 1.

Embodiment 8

Next, the eighth Embodiment of the present invention will be described.

Preferably, the semiconductor device of the present invention further includes an insulation film, opening portions to be filled are formed on a part of the semiconductor layer where it forms a junction with the anode electrode, the insulation film is formed so as to cover the opening portions to be filled, and the anode electrode forms a junction with the opening portions to be filled via the insulation film and forms a Schottky junction with parts excluding the opening portions to be filled. With such a configuration, the depletion layer is easily spread also in the opening portions to be filled at the time where a voltage is not applied to the semiconductor device of the present invention (i.e., in the off state). With respect to the semiconductor device of the foregoing configuration, at the anode electrode side of the semiconductor layer, the electric field (electric field concentration) is further easily relieved and a higher pressure resistance or the decrease of the on-state resistance are easily achieved. An example of such a semiconductor device is described in this Embodiment.

Figure 15:
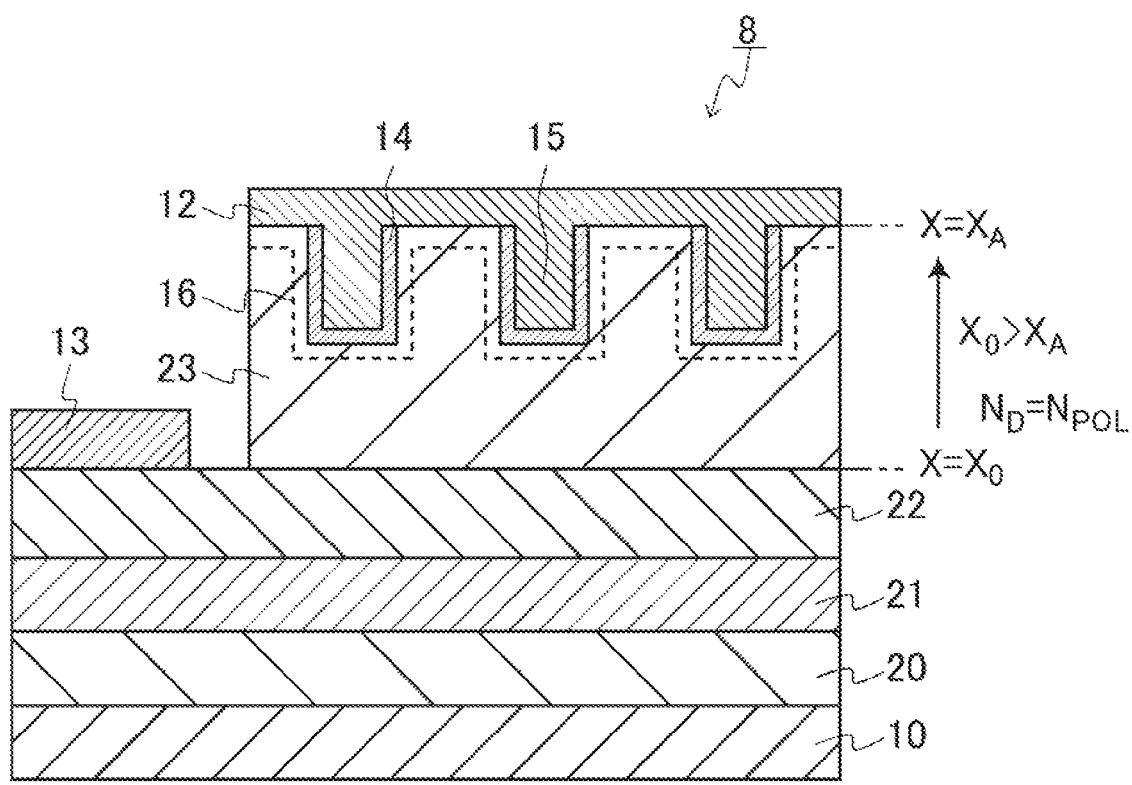
FIG. 15 is a view schematically showing the cross sectional structure of the SBD, which is the semiconductor device of Embodiment 8.

In the cross sectional view of FIG. 15, schematically shown is the structure of the SBD 8, which is the semiconductor device of this Embodiment. As shown in FIG. 15, the semiconductor device (SBD) 8 is the same as the SBD of Embodiment 1 (FIG. 1) except that trench portions (opening portions to be filled) 15 are formed at the upper part of the n-type compound semiconductor layer (composition change layer) 23, SBD 8 further includes an insulation film 14, and the anode electrode 12 forms a junction with the n-type compound semiconductor layer (composition change layer) 23 via the insulation film 14 in the trench portions 15. Hereinafter, SBD 8 will be described further in detail.

As described above, the semiconductor device 8 shown in FIG. 15 includes the insulation film 14. Further, in the semiconductor device 8, the trench portions (opening portions to be filled) 15 are formed at the upper part of the n-type compound semiconductor layer (composition change layer) 23 among the semiconductor layers formed of the layers 20 to 23, i.e., parts of a junction part of the n-type compound semiconductor layer (composition change layer) 23 where it forms a junction with the anode electrode 12. The insulation film 14 is formed so as to cover the trench portions (opening portions to be filled) 15. The anode electrode 12 forms a junction with the trench portions (opening portions to be filled) 15 via the insulation film 14. The insulation film 14 is not particularly limited and may be an insulation film that is generally used for a semiconductor device (element). Examples thereof include oxides such as $SiO_2$, SiON, $Al_2O_3$, and $HfO_2$. Further, the anode electrode 12 forms a Schottky junction with the parts of the junction part excluding the trench portions (opening portions to be filled) 15, i.e., the top surface of the n-type compound semiconductor layer (composition change layer) 23. Except for these, the structure of the semiconductor device (SBD) 8 is the same as that of the semiconductor device (SBD) of Embodiment 1 (FIG. 1). In the case where the anode electrode is made of metal, it can be said that the junction between the anode electrode and the semiconductor layer via the insulation film is a Metal-Insulator-Semiconductor (MIS) junction. In the case where the insulation film is an oxide, it can be said that the MIS junction is a Metal-Oxide-Semiconductor (MOS) junction.

In the semiconductor device 8 of FIG. 15, the n-type compound semiconductor layer (composition change layer) 23 can be formed, for example, of $Al_xGa_{1-x}N$ (0≤x<1) to which a donor impurity such as silicon is introduced. As with the semiconductor device (SBD) of Embodiment 1 (FIG. 1), the n-type compound semiconductor layer (n-type $Al_xGa_{1-x}N$ layer) 23 has the Al composition ratio of $x=x_0$ ($x_0>0$) at the lowest part (the principal surface at the cathode electrode side, i.e., the interface between the n-type compound semiconductor layer 23 and the $n^+$-type compound semiconductor layer 22) and has the Al composition ratio of $x=x_4$ ($x_4 \geq 0$) at the uppermost part (the principal surface at the anode electrode side, i.e., the interface between the n-type compound semiconductor layer 23 and the anode electrode 12 where a Schottky junction is formed). In the n-type $Al_xGa_{1-x}N$ layer 23, the Al composition ratio x changes from $x_0$ to $x_4$ from the lowest part (cathode electrode 13 side) toward the uppermost part (anode electrode 12 side) continuously or in a stepwise manner on a molecular layer basis (angstrom order).

In the n-type compound semiconductor layer (n-type $Al_xGa_{1-x}N$ layer) 23 of FIG. 15, the change of the Al composition ratio x (composition distribution) and the distribution of the donor impurity concentration are the same as those in Embodiment 1. That is, the n-type compound semiconductor layer (n-type $Al_xGa_{1-x}N$ layer) 23 of FIG. 15 has a constant polarization negative charge (negative polarization charge) density $N_{POL}$ and a constant donor impurity concentration $N_D=N_{POL}$ over the entire structure in the same manner as in Embodiment 1. Thereby, as in Embodiment 1, the semiconductor device (SBD) of this Embodiment can improve the trade-off between the on-state resistance and the pressure resistance beyond the physical limit.

Figure 16:
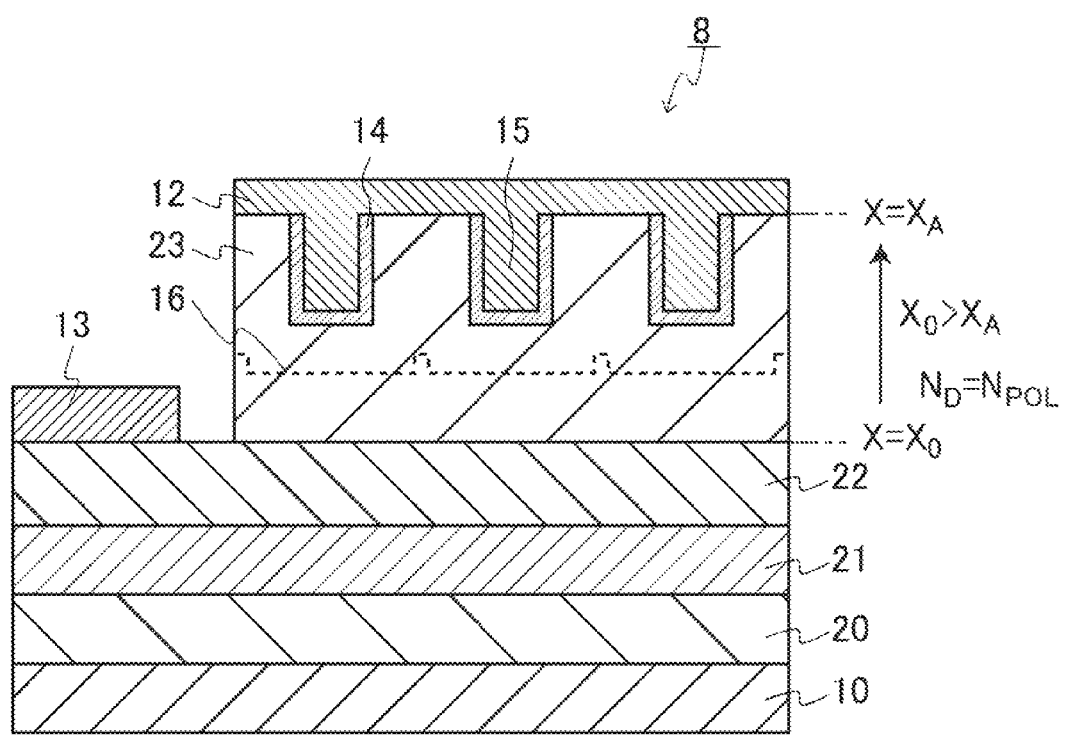
FIG. 16 is a cross sectional view schematically showing the structure of the SBD, which is the semiconductor device of Embodiment 8 in the off state.

Further, as described above, in the semiconductor device 8 of this Embodiment (FIG. 15), when a voltage is not applied (i.e., in the off state), a depletion layer is spread also from the side surface and the bottom surface of each of the trench portions (opening portions to be filled) 15. Therefore, in the semiconductor device 8, compared with the case of not including the trench portions (opening portions to be filled) 15 as in the case of Embodiment 1, a depletion layer is easily spread at the anode electrode 12 side when a voltage is not applied (i.e., in the off state). Specifically, it is as shown in FIG. 16, for example. Thereby, compared with the semiconductor device 1 of Embodiment 1 (FIG. 1), in the semiconductor device 8 of this Embodiment (FIG. 15), the electric field (electric field concentration) is further easily relieved and a higher pressure resistance is easily achieved at the anode electrode 12 side.

As described above, the semiconductor device of the present invention is preferably produced by the production method of the present invention although it is not particularly limited. It is preferable that the method of producing the semiconductor device of the present invention further includes, for example, an opening portion to be filled formation step of forming the opening portion to be filled at a part of the semiconductor layer and an insulation film formation step of forming the insulation film so as to cover the opening portions to be filled. In the electrode junction step, the anode electrode forms a junction with the opening portions to be filled via the insulation film and forms a Schottky junction with the parts excluding the opening portions to be filled. According to this method, for example, the semiconductor device of this Embodiment or the semiconductor devices of Embodiments 9 to 10 that will be described below can be formed. The method of producing the semiconductor device 8 shown in FIGS. 15 and 16 is not particularly limited. For example, the semiconductor device 8 shown in FIGS. 15 and 16 can be formed in the same manner as in Embodiment 1 except that the formation of the trench portions (opening portions to be filled) 15 (the opening portion to be filled formation step) and the formation of the insulation film 14 (the insulation film formation step) are performed in advance of the formation of the anode electrode 12, and the formation of a junction with the anode electrode 12 is performed as described above. In other words, the anode electrode 12 is formed so as to form a junction with the trench portions (opening portions to be filled) 15 via the insulation film 14 and to form a Schottky junction with the parts of the top surface of the n-type compound semiconductor layer (composition change layer) 23 excluding the trench portions (opening portions to be filled) 15. The method of forming the trench portions (opening portions to be filled) 15 is not particularly limited and the trench portions (opening portions to be filled) 15 may be formed, for example, by etching or the like. The method of forming the insulation film 14 is not particularly limited and the insulation film 14 may be formed, for example, by the MBE or the like.

As with the semiconductor device (SBD) of Embodiment 1, compared with the semiconductor device (SBD) in which the n-type compound semiconductor layer 23 is replaced with a layer having no composition change, the semiconductor device (SBD) of this Embodiment can decrease the on-state resistance at the same pressure resistance. Further, as in Embodiment 1, when the thickness of the n-type semiconductor layer 23 is the same as that of the layer having no composition change, a higher pressure resistance can be obtained at the same on-state resistance.

In this Embodiment, as in Embodiment 1, the case in which the polarization negative charge density and the donor impurity concentration are constant over the entire n-type compound semiconductor layer (composition change layer) 23 is described. However, this Embodiment is not limited thereto. In the n-type compound semiconductor layer (composition change layer) 23 of the semiconductor device of FIG. 15, the change of the Al composition ratio x (composition distribution) and the distribution of the donor impurity concentration may be the same as those in any one of Embodiments 3 to 7, for example. This makes it possible to improve the trade-off between the on-state resistance and the pressure resistance beyond the physical limit as in the case of Embodiments 3 to 7. Further, as described above, by providing the trench portions (opening portions to be filled) 15 and the insulation film 14, the electric field (electric field concentration) is further easily relieved and a higher pressure resistance is easily achieved.

For example, in FIG. 15, the cathode electrode 13 is formed on the top surface of the $n^+$-type compound semiconductor layer 22 in the same manner as in Embodiment 1. However, this Embodiment is not limited thereto. For example, the cathode electrode 13 may be formed at the bottom surface side of the substrate or the bottom surface side of the semiconductor layer in the same manner as in Embodiment 2.

In Embodiments 1 to 8, the examples in which n-type compound semiconductor layers 23, 38, and 40 to 44 have the composition (for example, the Al composition ratio) that changes over the entire structure are described. However, the present invention is not limited thereto, and a region in which the composition changes may be present at a part of the n-type compound semiconductor layer 23, 38, or 40 to 44, for example. For example, the n-type compound semiconductor layer 23, 38, or 40 to 44 may have the configuration in which plural regions in which the composition changes and plural regions in which the composition does not change are present alternately.

Embodiment 9

Next, the ninth Embodiment of the present invention will be described.

Figure 17:
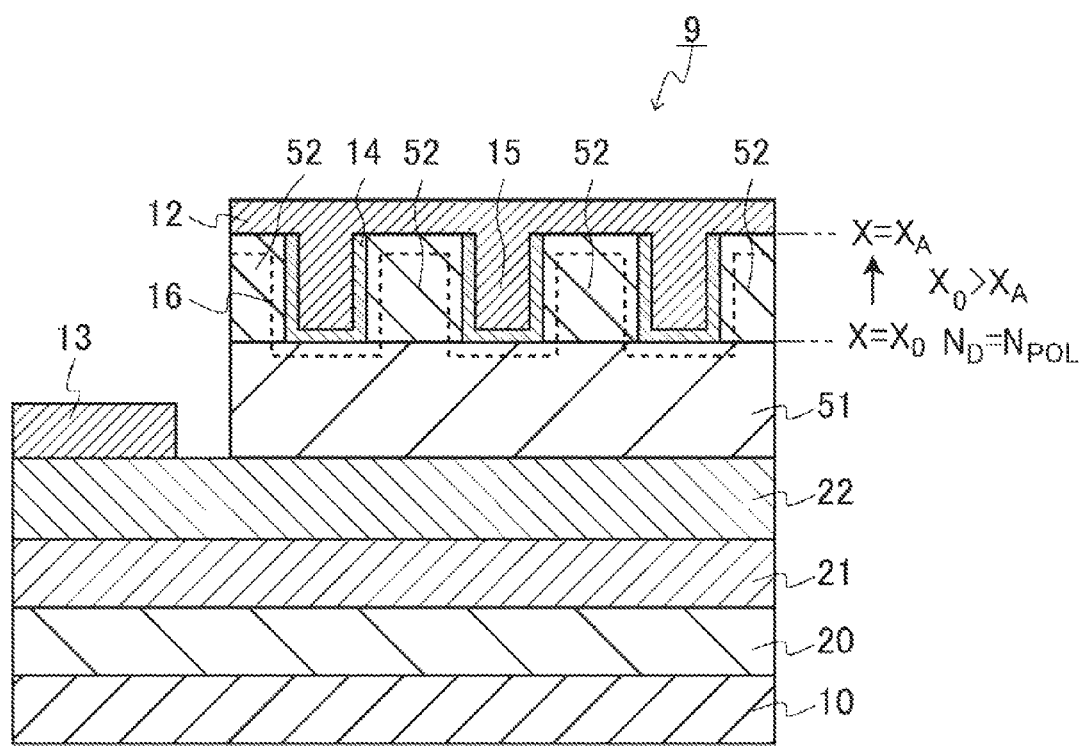
FIG. 17 is a view schematically showing the cross sectional structure of the SBD, which is the semiconductor device of Embodiment 9.

In the cross sectional view of FIG. 17, schematically shown is the structure of the SBD 9, which is the semiconductor device of this Embodiment. As shown in FIG. 17, the semiconductor device (SBD) 9 is the same as the SBD 8 of Embodiment 8 (FIG. 15) except that it includes an n-type compound semiconductor layer 51 and an n-type compound semiconductor layer (composition change layer) 52 in place of the n-type compound semiconductor layer (composition change layer) 23. The concentration of the donor impurity added to the $n^+$-type compound semiconductor layer 22 is higher than that of the donor impurity added to the n-type compound semiconductor layers 51 and 52.

The n-type compound semiconductor layers 51 and 52 are arranged on the same place as the n-type compound semiconductor layer 23 of FIG. 15, and the n-type compound semiconductor layers 51 and 52 are stacked over the n⁺-type compound semiconductor layer 22 in this order. Parts of the n-type compound semiconductor layer (composition change layer) 52 are removed from the top surface to the bottom surface, and thereby trench portions (opening portions to be filled) 15 are formed in the same manner as shown in FIG. 15. The bottom surface of the insulation film 14 is in contact with the top surface of the n-type compound semiconductor layer 51. As with the n⁺-type compound semiconductor layer 22, the n-type compound semiconductor layer 51 has the composition $Al_yGa_{1-y}N$ ($0 \leq y < 1$) that is uniform over the entire structure and satisfies the following equation: $y=x_0$ or $y \approx x_0$.

The n-type compound semiconductor layer (composition change layer) 52 can be formed, for example, of $Al_xGa_{1-x}N$ ($0 \leq x < 1$) to which a donor impurity such as silicon is introduced. The n-type compound semiconductor layer (n-type $Al_xGa_{1-x}N$ layer) 52 has the Al composition ratio of $x=x_0$ ($x_0 > 0$) at the lowest part (the principal surface at the cathode electrode side, i.e., the interface between the n-type compound semiconductor layer 52 and the n-type compound semiconductor layer 51) and has the Al composition ratio of $x=x_A$ ($x_A \geq 0$) at the uppermost part (the principal surface at the anode electrode side, i.e., the interface between the n-type compound semiconductor layer 52 and the anode electrode 12 where a Schottky junction is formed). In the n-type $Al_xGa_{1-x}N$ layer 52, the Al composition ratio x changes from $x_0$ to $x_A$ from the lowest part (cathode electrode 13 side) toward the uppermost part (anode electrode 12 side) continuously or in a stepwise manner on a molecular layer basis (angstrom order). The change of the Al composition ratio (composition distribution) and the distribution of the donor impurity concentration are the same as those of the n-type compound semiconductor layers 23, 38, 41, 42, 43 and 44 of the semiconductor devices (SBDs) of Embodiments 1 to 8 (FIGS. 1, 5 to 7, 10, 12, 14 and 15).

As with the semiconductor device 8 of Embodiment 8 (FIG. 15), in the semiconductor device of this Embodiment, since the depletion layer is easily spread at the anode electrode 12 side by providing the trench portions (opening portions to be filled) 15, the electric field (electric field concentration) is further easily relieved and a higher pressure resistance is easily achieved.

Further, as with the aforementioned Embodiments, since the semiconductor device of this Embodiment includes the n-type compound semiconductor layer (composition change layer) 52, it can improve the trade-off between the on-state resistance and the pressure resistance beyond the physical limit.

Further, since the composition change layer is intensively formed at the part upper than the lower ends of the opening portions to be filled (trench portions), the semiconductor device of this Embodiment shows a superior effect particularly in the decrease of the on-state resistance. In other words, in the semiconductor device in which the trench portions (opening portions to be filled) are formed as in this Embodiment or Embodiment 8, particularly, the resistance tends to be got large at the part upper than the lower ends of the trench portions (opening portions to be filled). This is because the area of the anode electrode through which a current can be passed is narrow as compared to the case in which the trench portions (opening portions to be filled) are not formed. However, when the composition change layer is present at the part upper than the lower end of the trench portions (opening portions to be filled), the trade-off between the on-state resistance and the pressure resistance can be improved beyond the physical limit. Therefore, even when the trench portions (opening portions to be filled) are formed shallowly to decrease the on-state resistance, a relatively high pressure resistance can be obtained. Although such an effect can be obtained also in Embodiment 8, since the composition change layer is intensively present at the part upper than the lower ends of the trench portions (opening portions to be filled) in this Embodiment, the effect of decreasing the resistance in this part is further remarkable. From this point of view, in the present invention, it is preferable that the bottom surface of the composition change layer is arranged on the same level as or on a higher level than the lower ends of the opening portion to be filled.

As described above, the semiconductor device of this Embodiment shows a superior effect particularly in the decrease of the on-state resistance. For example, in the semiconductor device having the pressure resistance of 500V or less, which is low, since a low-value resistance is particularly important, it is advantageous to have the structure of this Embodiment. However, the semiconductor device of this Embodiment is not limited thereto and the semiconductor device having the pressure resistance of more than 500V is applicable.

With respect to the n-type compound semiconductor layer (composition change layer) 52, FIG. 17 shows an example in which the polarization negative charge and the donor impurity concentration are equal ($N_D = N_{POL}$) over the entire structure. However, the polarization negative charge and the distribution of the donor impurity concentration are not limited thereto, and, for example, may be the same as those in Embodiments 3 to 8 as described above.

The method of producing the semiconductor device 9 shown in FIG. 17 is not particularly limited. For example, the semiconductor device 9 may be produced in the same manner as in Embodiment 8 except that the n-type compound semiconductor layer 51 and the n-type compound semiconductor layer (composition change layer) 52 are formed in place of the n-type compound semiconductor layer (composition change layer) 23 and the trench portions 15 are formed by removing parts of the n-type compound semiconductor layer (composition change layer) 52 from the top surface to the bottom surface.

As with the semiconductor device (SBD) of Embodiment 1, compared with the semiconductor device (SBD) in which the n-type compound semiconductor layer 52 is replaced with a layer having no composition change, the semiconductor device (SBD) of this Embodiment can decrease the on-state resistance at the same pressure resistance. Further, as in Embodiment 1, when the thickness of the n-type semiconductor layer 52 is the same as that of the layer having no composition change, a higher pressure resistance can be obtained at the same on-state resistance. Further, as described above, this Embodiment shows a remarkable effect particularly in the decrease of the resistance.

Embodiment 10

Next, the tenth Embodiment of the present invention will be described.

Figure 18:
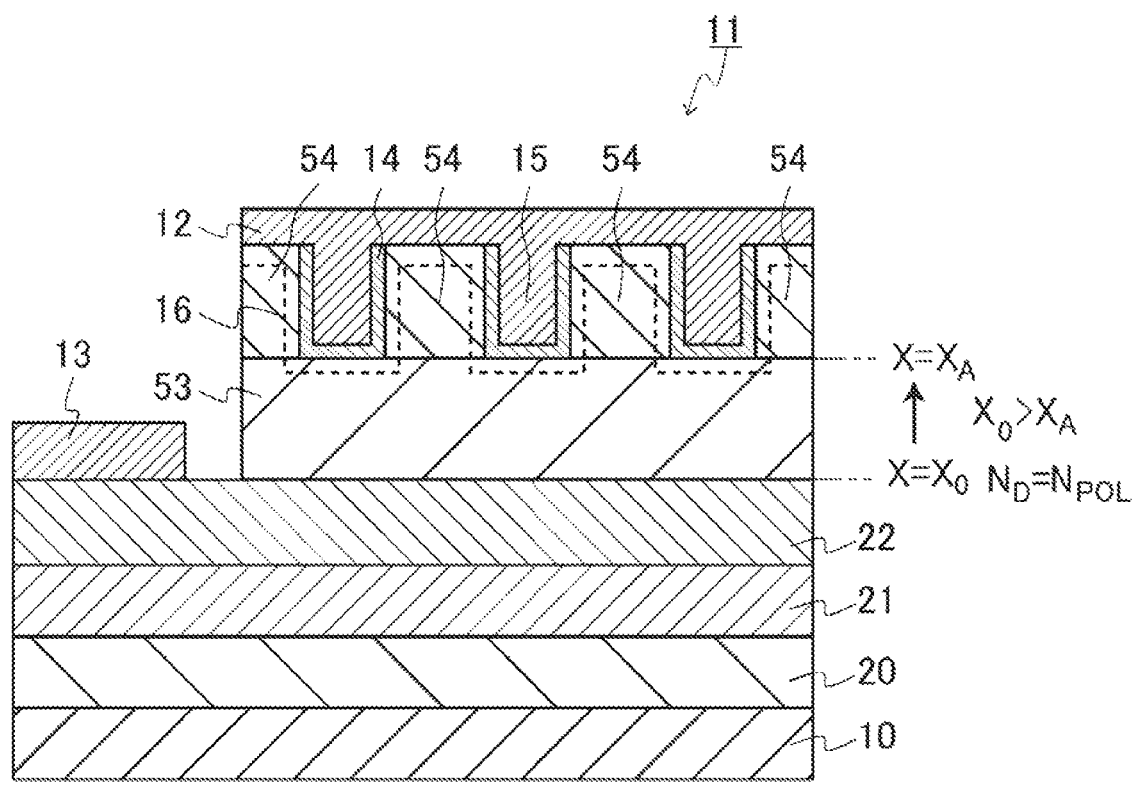
FIG. 18 is a view schematically showing the cross sectional structure of the SBD, which is the semiconductor device of Embodiment 10.

In the cross sectional view of FIG. 18, schematically shown is the structure of the SBD 11, which is the semiconductor device of this Embodiment. As shown in FIG. 17, the semiconductor device (SBD) 11 is the same as the SBD 9 of Embodiment 9 (FIG. 17) except that it includes a composition change layer (n-type semiconductor layer) 53 in place of the n-type compound semiconductor layer 51 having constant composition and includes an n-type compound semiconductor layer 54 having constant composition in place of the composition change layer (n-type compound semiconductor layer) 52. That is, in this Embodiment, with respect to the n-type compound semiconductor layers that are formed over the n$^+$-type compound semiconductor layer 22, the layer in which composition is constant and the layer in which composition changes are arranged upside down relative to Embodiment 9. The concentration of the donor impurity added to the n$^+$-type compound semiconductor layer 22 is higher than that of the donor impurity added to the n-type compound semiconductor layers 53 and 54.

The n-type compound semiconductor layers 53 and 54 are stacked over the n$^+$-type compound semiconductor layer 22 in this order. Parts of the n-type compound semiconductor layer 54 are removed from the top surface to the bottom surface, and trench portions (opening portions to be filled) 15 are formed in the same manner as shown in FIG. 15. The bottom surface of the insulation film 14 is in contact with the top surface of the n-type compound semiconductor layer (composition change layer) 53.

The n-type compound semiconductor layer (composition change layer) 53 can be formed, for example, of $Al_xGa_{1-x}N$ ($0 \leq x < 1$) to which a donor impurity such as silicon is introduced. The n-type compound semiconductor layer (n-type $Al_xGa_{1-x}N$ layer) 53 has the Al composition of ratio $x=x_0$ ($x_0>0$) at the lowest part (the principal surface at the cathode electrode side, i.e., the interface between the n-type compound semiconductor layer 53 and the n$^+$-type compound semiconductor layer 22) and has the Al composition ratio of $x=x_A$ ($x_A \geq 0$) at the uppermost part (the principal surface at the anode electrode side, i.e., the interface between the n-type compound semiconductor layer 53 and the n-type compound semiconductor layer 54). In the n-type $Al_xGa_{1-x}N$ layer 53, the Al composition ratio x changes from $x_0$ to $x_A$ from the lowest part (cathode electrode 13 side) toward the uppermost part (anode electrode 12 side) continuously or in a stepwise manner on a molecular layer basis (angstrom order). The change of the Al composition ratio (composition distribution) and the distribution of the donor impurity concentration are the same as those of the n-type compound semiconductor layer 23 of the semiconductor device (SBD) of any of Embodiments 1 to 8 (FIG. 1, 5, 6, 7, 10, 12, 14, or 15). The n-type compound semiconductor layer 54 has uniform composition $Al_zGa_{1-z}N$ ($0 \leq z < 1$) over the entire structure and satisfies the following equation: $z=x_A$ or $z \approx x_A$.

As with the semiconductor device 8 of Embodiment 8 (FIG. 15), in the semiconductor device of this Embodiment, since the depletion layer is easily spread at the anode electrode 12 side by providing the trench portions (opening portions to be filled) 15, the electric field (electric field concentration) is further easily relieved and a higher pressure resistance is easily achieved.

Further, as with the aforementioned Embodiments, since the semiconductor device of this Embodiment includes the n-type compound semiconductor layer (composition change layer) 54, it can improve the trade-off between the on-state resistance and the pressure resistance beyond the physical limit.

Further, since the composition change layer is intensively formed at the part lower than the lower ends of the opening portions to be filled (trench portions), the semiconductor device of this Embodiment shows a superior effect particularly in the increase of the pressure resistance. Therefore, for example, in the semiconductor device that requires the pressure resistance of 500V or more, which is high, particularly, it is advantageous to have the structure of this Embodiment.

However, the semiconductor device of this Embodiment is not limited thereto and the semiconductor device having the pressure resistance of less than 500V is applicable. From this point of view, in the semiconductor device of the present invention, it is preferable that the top surface of the composition change layer is arranged lower than the upper ends of the opening portions to be filled at the junction part where it forms a junction with the anode electrode, and it is more preferable that the top surface of the composition change layer is arranged on the same level as or on a lower level than the lower ends of the opening portions to be filled.

With respect to the n-type compound semiconductor layer (composition change layer) 53, FIG. 18 shows an example in which the polarization negative charge and the donor impurity concentration are equal ($N_D = N_{POL}$) over the entire structure. However, the polarization negative charge and the distribution of the donor impurity concentration are not limited thereto, and, for example, may be the same as those in Embodiments 2 to 8 as described above.

The method of producing the semiconductor device 11 shown in FIG. 18 is not particularly limited. For example, the semiconductor device 9 may be produced in the same manner as in Embodiment 8 except that the n-type compound semiconductor layer 53 (composition change layer) and the n-type compound semiconductor layer 54 are formed in place of the n-type compound semiconductor layer (composition change layer) 23 and the trench portions 15 are formed by removing parts of the n-type compound semiconductor layer 54 from the top surface to the bottom surface.

As with the semiconductor device (SBD) of Embodiment 1, compared with the semiconductor device (SBD) in which the n-type compound semiconductor layer 53 is replaced with a layer having no composition change, the semiconductor device (SBD) of this Embodiment can decrease the on-state resistance at the same pressure resistance. Further, as in Embodiment 1, when the thickness of the n-type semiconductor layer 53 is the same as that of the layer having no composition change, a higher pressure resistance can be obtained at the same on-state resistance. Further, as described above, this Embodiment shows a remarkable effect particularly in the increase of the pressure resistance.

The Embodiments of the present invention are described by referring to the figures. However, these are mere illustrations of the present invention and various configurations other than those can be employed. As described above, the substrates (support substrates) 10 and 34 can be any substrate such as a Si substrate, a SiC substrate, a GaN substrate, a SOI, or the like. Further, in the semiconductor devices 3 to 9 and 11 of Embodiments 3 to 10 (FIGS. 6, 7, 10, 12, 14, 15, 17, and 18), the cathode electrode 13 is formed at the top surface (front surface) side of the semiconductor layer as in Embodiment 1. However, the semiconductor devices 3 to 9 and 11 are not limited thereto, and the cathode electrode may be formed at the bottom surface (back surface) side of the semiconductor layer as with the semiconductor device 2 of Embodiment 2 (FIG. 5).

Further, in the semiconductor device of the present invention, the material and configuration of the semiconductor layer are not limited to the aforementioned description and any material and configuration can be employed. For example, as described above, although the semiconductor layer is preferably formed of a nitride semiconductor layer and is more preferably formed of a III-nitride semiconductor, it is not limited thereto. Further, in Embodiments 1 and 3 to 10, the n$^+$-type compound semiconductor layer 22 (FIGS. 1, 6, 7, 10, 12, 14, 15, 16, 17, and 18) is the layer that is formed for decreasing the contact resistance with the cathode electrode 13. The semiconductor device of the present invention may have the embodiment in which the n+-type compound semiconductor layer 22 is not formed but the n-type compound semiconductor layer 23 is directly formed (grown) over the second buffer layer 21. In the case of this embodiment, for example, the cathode electrode 13 may directly be formed on the top surface of the second buffer layer 21. Alternatively, for decreasing the contact resistance, a donor impurity may be added to the second buffer layer 21 at high concentrations and the cathode electrode 13 may be formed on the top surface of the second buffer layer 21. Similarly, the n+-type compound semiconductor layer 37 of Embodiment 2 (FIG. 5) is the layer that is formed for decreasing the contact resistance with the cathode electrode 33. The semiconductor device of the present invention may have the embodiment in which the n+-type compound semiconductor layer 37 is not formed but the n-type compound semiconductor layer 38 is grown over the second buffer layer 36. In the case of this embodiment, for example, the cathode electrode 33 may directly be formed on the bottom surface (back surface) of the second buffer layer 36. Alternatively, for decreasing the contact resistance, a donor impurity may be added to the second buffer layer 36 at high concentrations and the cathode electrode 33 may be formed on the back surface of the second buffer layer 36.

Further, in Embodiments 1 to 10, shown are the examples in which the composition change layer is AlGaN. However, the composition change layer is not limited thereto, and the III-nitride semiconductors other than AlGaN may be employed, for example. Examples of the III-nitride semiconductors include InGaN, and InAlGaN. More specifically, for example, the composition change layer may have the composition represented by $In_vGa_{1-v}N$ ($0 \leq v < 1$), and the composition ratio v may increase from the cathode electrode side toward the anode electrode side. In such a case, the relationship between the composition ratio $v_0$ ($v_0 \geq 0$) of InGaN at the interface at the cathode electrode side and the composition ratio $v_A$ ($v_A > 0$) of InGaN at the interface at the anode electrode side satisfies the following equation: $v_A > v_0$. Further, for example, the second n-type semiconductor layer may have the composition that is represented by $In_vAl_xGa_{1-x-v}N$ ($0 \leq x < 1$ and $0 \leq v < 1$), and may satisfy at least one of the condition in which the composition ratio x increases from the cathode electrode side toward the anode electrode side and the condition in which the composition ratio v decreases from the cathode electrode side toward the anode electrode side. In the case where the composition ratio x increases from the cathode electrode side toward the anode electrode side, the relationship between the composition ratio $x_0$ ($x_0 \geq 0$) at the interface at the cathode electrode side and the composition ratio $x_A$ ($x_A > 0$) at the interface at the anode electrode side satisfies the following equation: $x_A > x_0$. In the case where the composition ratio v decreases from the cathode electrode side toward the anode electrode side, the relationship between the composition ratio $v_0$ ($v_0 \geq 0$) at the interface at the cathode electrode side and the composition ratio $v_A$ ($v_A > 0$) at the interface at the anode electrode side satisfies the following equation: $v_0 > v_A$. The change of the composition (composition distribution) of the aforementioned $In_vGa_{1-v}N$ and $In_vAl_xGa_{1-x-v}N$ and the distribution of the donor impurity concentration can be pursuant to the $Al_xGa_{1-x}N$ ($0 \leq x < 1$) layer of Embodiments 1 to 10, for example. Further, the n+-type compound semiconductor layer adjacent to the interface at the cathode electrode side of the composition change layer may be GaN, for example. However, the n+-type compound semiconductor layer is not limited to GaN and any n+-type compound semiconductor layer can be employed. Further, as described above, the present invention is not limited to the embodiment that includes the n+-type compound semiconductor layer.

As described above, in the semiconductor device of the present invention, the change of the composition (composition distribution) in the composition change layer may be continuous or stepwise. In Embodiments 1 to 10, illustrated are the examples in which the composition change layer is an AlGaN layer, however, the same applies to the case in which the composition change layer is a layer other than the AlGaN layer. Further, in the case where the composition of the composition change layer changes in K steps, K can be any integer more than 1. As described above, when the number of K is sufficiently large, it can be regarded that the composition change is continuous. Further, the semiconductor layer of the semiconductor device of the present invention may have the configuration in which plural layers in which the composition changes and plural layers in which the composition is constant (does not change) are present alternately.

Further, as described above, the electronic apparatus of the present invention includes the semiconductor device of the present invention. For example, the electronic apparatus of the present invention can be widely used for various electronic apparatuses such as image displays, information recording and reproducing devices, communication devices, motor control devices (for electric cars and air conditioners, for example), power-supply devices (for computers, for example), inverter lighting, high-frequency power generators (for microwave ovens and electromagnetic cooking devices, for example).

EXAMPLES

Example 1

A semiconductor device 1 having the structure shown in FIG. 1 was produced as follows. That is, first, a substrate 10 made of sapphire was provided. Next, a semiconductor layer having the stacking structure of a III-nitride semiconductor was formed over the substrate 10 by the molecular beam epitaxy (MBE). The formation of the semiconductor layer was performed by allowing a first buffer layer 20 (thickness: 20 nm) made of undoped AlN, a second buffer layer 21 (thickness; 2 µm) made of undoped AlGaN, a compound semiconductor layer 22 (thickness: 500 nm, doping concentration (donor impurity concentration): $3 \times 10^{18}$ cm$^{-3}$, and Al composition ratio: y=0.3) made of n+-type AlGaN, and a compound semiconductor layer (composition change layer) 23 (thickness: 1.8 µm and doping concentration (donor impurity concentration): $7.1 \times 10^{16}$ cm$^{-3}$) made of n-type $Al_xGa_{1-x}N$ to be grown from the substrate 10 side in this order. The n+-type compound semiconductor layer 22 was allowed to be grown such that the Ga surface becomes the top surface. Silicon (Si) was used as the donor impurity that was added to the n+-type compound semiconductor layer 22 and the n-type compound semiconductor layer (composition change layer) 23.

The n-type compound semiconductor layer (composition change layer, n-type $Al_xGa_{1-x}N$ layer) 23 was formed by allowing it to be grown such that it has the Al composition ratio of x=0.3 at the bottom surface and has the Al composition ratio of x=0 at the top surface. The Al composition ratio x was controlled such that it changes from the bottom surface toward the top surface of the n-type compound semiconductor layer 23 continuously. At this time, as has been described in Embodiment 1, the Al composition ratio x was controlled so that the polarization negative charge density is uniform over the entire n-type $Al_xGa_{1-x}N$ layer (composition change layer) 23. Further, as has been described in Embodiment 1, the doping concentration (donor impurity concentration) of the n-type $Al_xGa_{1-x}N$ layer (composition change layer) 23 was controlled such that it is uniform over the entire n-type $Al_xGa_{1-x}N$ layer (composition change layer) 23.

Next, a part of the n-type compound semiconductor layer 23 was removed by etching until the top surface of the $n^+$-type compound semiconductor layer 22 was exposed. A cathode electrode 13 was formed over the resultant exposed surface of the $n^+$-type compound semiconductor layer 22 by vapor deposition of a Ti/Al multilayer film. Thereafter, an ohmic contact between the cathode electrode 13 and the $n^+$-type compound semiconductor layer 22 was released by annealing at 650° C.

Next, an anode electrode 12 was formed over the n-type compound semiconductor layer 23 by vapor deposition of a Ni/Au multilayer film. The semiconductor device (SBD) 1 having the structure shown in FIG. 1 was produced (made) in this manner. This semiconductor device 1 had the on-state resistance of $1.6\times10^{-5}$ $\Omega cm^2$ relative to the pressure resistance of 600 V. Further, an SBD (Reference Example 1) in which a GaN layer (having no composition change) was formed in place of the n-type compound semiconductor layer 23 was made. The thickness of the GaN layer was adjusted such that the pressure resistance of the SBD of Reference Example 1 becomes the same as that of the SBD of this Example. As a result, the pressure resistance of the SBD of this Example was approximately the same as that of the SBD of Reference Example 1 whereas the on-state resistance of the SBD of this Example was about ⅓ of that of the SBD of Reference Example 1.

Example 2

A semiconductor device 2 having the structure shown in FIG. 5 was produced. That is, first, a substrate 34 made of SiC was provided. Next, a semiconductor layer having the stacking structure of a III-nitride semiconductor was formed over the substrate 34 by the MBE. The formation of the semiconductor layer was performed by allowing a first buffer layer 35 (thickness: 20 nm) made of undoped AlN, a second buffer layer 36 (thickness; 2 µm) made of undoped AlGaN, a compound semiconductor layer 37 (thickness: 500 nm, doping concentration: $3\times10^{18}$ $cm^{-3}$, and Al composition ratio: y=0.3) made of $n^+$-type AlGaN, and a compound semiconductor layer 38 (thickness: 1.8 µm and doping concentration: $7.1\times10^{16}$ $cm^{-3}$) made of n-type AlGaN to be grown from the substrate 34 side in this order. The $n^+$-type compound semiconductor layer 37 was allowed to be grown such that the Ga surface becomes the top surface. Silicon (Si) was used as the donor impurity that was added to the $n^+$-type compound semiconductor layer 37 and the n-type compound semiconductor layer (composition change layer) 38.

The n-type compound semiconductor layer (composition change layer, n-type $Al_xGa_{1-x}N$ layer) 38 was formed (grown) such that it has the Al composition ratio of x=0.3 at the bottom surface and has the Al composition ratio of x=0 at the top surface. The Al composition ratio x was controlled such that it changes from the bottom surface toward the top surface of the n-type compound semiconductor layer 38 continuously or in a stepwise manner on a molecular layer basis (angstrom order). At this time, as has been described in Embodiments 1 and 2, the Al composition ratio x was controlled so that the polarization negative charge density is uniform over the entire n-type $Al_xGa_{1-x}N$ layer (composition change layer) 38. Further, as has been described in Embodiments 1 and 2, the doping concentration (donor impurity concentration) of the n-type $Al_xGa_{1-x}N$ layer (composition change layer) 38 was controlled such that it is uniform over the entire n-type $Al_xGa_{1-x}N$ layer (composition change layer) 38.

Next, an anode electrode 39 was formed over the n-type compound semiconductor layer 38 by vapor deposition of a Ni/Au multilayer film, for example. Further, parts of the substrate 34, the first buffer layer 35, the second buffer layer 36, and the $n^+$-type compound semiconductor layer 37 were removed by etching to form a via hole (opening portion to be filled) that extends from the bottom surface (back surface) of the substrate 34 to the lower part of the $n^+$-type compound semiconductor layer 37. Further, a cathode electrode 33 was formed on the bottom surface of the substrate 34 and in the via hole by vapor deposition of a Ti/Al multilayer film. The cathode electrode 33 was formed so as to be in contact with the $n^+$-type compound semiconductor layer 37. The semiconductor device (SBD) 2 was produced (made) in this manner.

The semiconductor device 2 actually made in this manner had the on-state resistance of $1.6\times10^{-5}$ $\Omega cm^2$ relative to the pressure resistance of 600 V. Further, an SBD (Reference Example 2) in which a GaN layer (having no composition change) was formed in place of the n-type compound semiconductor layer 38 was made. The thickness of the GaN layer was adjusted such that the pressure resistance of the SBD of Reference Example 2 becomes the same as that of the SBD of this Example. As a result, the pressure resistance of the SBD of this Example was approximately the same as that of the SBD of Reference Example 2 whereas the on-state resistance of the SBD of this Example was about ⅓ of that of the SBD of Reference Example 2.

Example 3

A semiconductor device 3 having the structure shown in FIG. 6 was produced in the same manner as in Example 1 except that an n-type $Al_xGa_{1-x}N$ layer (composition change layer) 40 was formed in place of the n-type $Al_xGa_{1-x}N$ layer (composition change layer) 23. With respect to the n-type $Al_xGa_{1-x}N$ layer (composition change layer) 40, the thickness was 1.8 µm and the silicon doping concentration (donor impurity concentration) was $7.1\times10^{16}$ $cm^{-3}$. The n-type $Al_xGa_{1-x}N$ layer 40 was formed (grown) such that it has the Al composition ratio of x=0.3 at the bottom surface and has the Al composition ratio of x=0 at the top surface. The Al composition ratio x was controlled such that it changes from the bottom surface toward the top surface of the n-type compound semiconductor layer (composition change layer, n-type $Al_xGa_{1-x}N$ layer) 40 continuously. At this time, as has been described in Embodiment 3, in the n-type $Al_xGa_{1-x}N$ layer (composition change layer) 40, the change of the thickness was kept constant with respect to the change of the Al composition ratio x. Therefore, in the n-type $Al_xGa_{1-x}N$ layer (composition change layer) 40, the volume density of the polarization negative charge showed the highest value at the lowest part (the principal surface at the cathode electrode side, i.e., the interface between the n-type $Al_xGa_{1-x}N$ layer 40 and the $n^+$-type compound semiconductor layer 22) and showed the lowest value at the uppermost part (the principal surface at the anode electrode side, i.e., the interface between the n-type $Al_xGa_{1-x}N$ layer 40 and the anode electrode 12). The donor impurity concentration in the n-type $Al_xGa_{1-x}N$ layer (composition change layer) 40 was adjusted such that it becomes equal to the volume density of the polarization negative charge over the entire structure, whereby the polarization negative charge can be completely cancelled. Here, the aforementioned silicon doping concentration (donor impurity concentration), $7.1 \times 10^{16}$ cm$^{-3}$, is the average value over the entire n-type Al$_x$Ga$_{1-x}$N layer (composition change layer) 40.

The semiconductor device 3 that was made according to this Example had the on-state resistance of $1.6 \times 10^{-5}$ Ωcm$^2$ relative to the pressure resistance of 600 V. Further, an SBD (Reference Example 3) in which a GaN layer (having no composition change) was formed in place of the n-type compound semiconductor layer 40 was made. The thickness of the GaN layer was adjusted such that the pressure resistance of the SBD of Reference Example 3 becomes the same as that of the SBD of this Example. As a result, the pressure resistance of the SBD of this Example was approximately the same as that of the SBD of Reference Example 3 whereas the on-state resistance of the SBD of this Example was about ⅓ of that of the SBD of Reference Example 3.

Example 4

A semiconductor device 4 having the structure shown in FIG. 7 was produced in the same manner as in Example 1 except that an n-type Al$_x$Ga$_{1-x}$N layer (composition change layer) 41 was formed in place of the n-type Al$_x$Ga$_{1-x}$N layer (composition change layer) 23. With respect to the n-type Al$_x$Ga$_{1-x}$N layer (composition change layer) 41, the thickness was 3.6 μm and the silicon doping concentration (donor impurity concentration) was $1.1 \times 10^{17}$ cm$^{-3}$. The n-type compound semiconductor layer (composition change layer, n-type Al$_x$Ga$_{1-x}$N layer) 41 was formed (grown) such that it has the Al composition ratio of x=0.62 at the bottom surface and has the Al composition ratio of x=0 at the top surface. The Al composition ratio x was controlled such that it changes from the bottom surface toward the top surface of the n-type compound semiconductor layer 41 continuously. At this time, as has been described in Embodiment 4, in the n-type Al$_x$Ga$_{1-x}$N layer (composition change layer) 41, the change of the thickness was kept constant with respect to the change of the Al composition ratio x. Therefore, in the n-type Al$_x$Ga$_{1-x}$N layer (composition change layer) 41, the volume density of the polarization negative charge showed the highest value at the lowest part (the principal surface at the cathode electrode side, i.e., the interface between the n-type Al$_x$Ga$_{1-x}$N layer 41 and the n$^+$-type compound semiconductor layer 22) and showed the lowest value at the uppermost part (the principal surface at the anode electrode side, i.e., the interface between the n-type Al$_x$Ga$_{1-x}$N layer 41 and the anode electrode 12). Further, in the n-type compound semiconductor layer 41, the donor impurity concentration was made uniform over the entire n-type compound semiconductor layer 41 as described above and was made equal to the polarization negative charge at the lowest part (the principal surface at the cathode electrode side, i.e., the interface between the n-type compound semiconductor layer 41 and the n$^+$-type compound semiconductor layer 22).

The semiconductor device 4 of this Example made in this manner had the on-state resistance of $2.1 \times 10^{-5}$ Ωcm$^2$ relative to the pressure resistance of 600 V. Further, an SBD (Reference Example 4) in which a GaN layer (having no composition change) was formed in place of the n-type compound semiconductor layer 41 was made. The thickness of the GaN layer was adjusted such that the pressure resistance of the SBD of Reference Example 4 becomes the same as that of the SBD of this Example. As a result, the pressure resistance of the SBD of this Example was approximately the same as that of the SBD of Reference Example 4 whereas the on-state resistance of the SBD of this Example was about ½ of that of the SBD of Reference Example 4.

Example 5

A semiconductor device 5 having the structure shown in FIG. 10 was produced in the same manner as in Example 1 except that an n-type Al$_x$Ga$_{1-x}$N layer (composition change layer) 42 was formed in place of the n-type Al$_x$Ga$_{1-x}$N layer (composition change layer) 23. With respect to the n-type Al$_x$Ga$_{1-x}$N layer (composition change layer) 42, the thickness was 3.6 μm and the silicon doping concentration (donor impurity concentration) was $9 \times 10^{16}$ cm$^{-3}$. The n-type compound semiconductor layer (composition change layer, n-type Al$_x$Ga$_{1-x}$N layer) 42 was formed (grown) such that it has the Al composition ratio of x=0.62 at the bottom surface and has the Al composition ratio of x=0 at the top surface. The Al composition ratio x was controlled such that it changes from the bottom surface toward the top surface of the n-type compound semiconductor layer 42 continuously. At this time, as has been described in Embodiment 5, in the n-type Al$_x$Ga$_{1-x}$N layer (composition change layer) 42, the change of the thickness was kept constant with respect to the change of the Al composition ratio x. Therefore, in the n-type Al$_x$Ga$_{1-x}$N layer (composition change layer) 42, the volume density of the polarization negative charge showed the highest value at the lowest part (the principal surface at the cathode electrode side, i.e., the interface between the n-type Al$_x$Ga$_{1-x}$N layer 42 and the n$^+$-type compound semiconductor layer 22) and showed the lowest value at the uppermost part (the principal surface at the anode electrode side, i.e., the interface between the n-type Al$_x$Ga$_{1-x}$N layer 42 and the anode electrode 12). Further, in the n-type compound semiconductor layer 42, the donor impurity concentration was made uniform over the entire n-type compound semiconductor layer 42 as described above and was made equal to the polarization negative charge at the uppermost part (the principal surface at the anode electrode side, i.e., the interface between the n-type compound semiconductor layer 42 and the anode electrode 12).

The semiconductor device 5 of this Example made in this manner had the on-state resistance of $2.2 \times 10^{-5.0}$ cm$^2$ relative to the pressure resistance of 600 V. Further, an SBD (Reference Example 5) in which a GaN layer (having no composition change) was formed in place of the n-type compound semiconductor layer 42 was made. The thickness of the GaN layer was adjusted such that the pressure resistance of the SBD of Reference Example 5 becomes the same as that of the SBD of this Example. As a result, the pressure resistance of the SBD of this Example was approximately the same as that of the SBD of Reference Example 5 whereas the on-state resistance of the SBD of this Example was about ½ of that of the SBD of Reference Example 35.

Example 6

A semiconductor device 6 having the structure shown in FIG. 12 was produced in the same manner as in Example 1 except that an n-type Al$_x$Ga$_{1-x}$N layer (composition change layer) 43 was formed in place of the n-type Al$_x$Ga$_{1-x}$N layer (composition change layer) 23. With respect to the n-type Al$_x$Ga$_{1-x}$N layer (composition change layer) 43, the thickness was 3.6 μm and the silicon doping concentration (donor impurity concentration) was $8.5 \times 10^{16}$ cm$^{-3}$. The n-type compound semiconductor layer (composition change layer, n-type Al$_x$Ga$_{1-x}$N layer) 43 was formed (grown) such that it has the Al composition ratio of x=0.3 at the bottom surface and has the Al composition ratio of x=0 at the top surface. The Al composition ratio x was controlled such that it changes from the bottom surface toward the top surface of the n-type compound semiconductor layer (composition change layer, n-type $Al_xGa_{1-x}N$ layer) 43 continuously. At this time, as has been described in Embodiment 6, in the n-type $Al_xGa_{1-x}N$ layer (composition change layer) 43, the change of the thickness was kept constant with respect to the change of the Al composition ratio x. Therefore, in the n-type $Al_xGa_{1-x}N$ layer (composition change layer) 43, the volume density of the polarization negative charge showed the highest value at the lowest part (the principal surface at the cathode electrode side, i.e., the interface between the n-type $Al_xGa_{1-x}N$ layer 43 and the $n^+$-type compound semiconductor layer 22) and showed the lowest value at the uppermost part (the principal surface at the anode electrode side, i.e., the interface between the n-type $Al_xGa_{1-x}N$ layer 43 and the anode electrode 12). Further, in the n-type compound semiconductor layer 43, the donor impurity concentration was made uniform over the entire n-type compound semiconductor layer 43 as described above and was made larger than the polarization negative charge density over the entire n-type compound semiconductor layer 43 as described above.

The semiconductor device 6 of this Example made in this manner had the on-state resistance of $2.7 \times 10^{-5} \, \Omega cm^2$ relative to the pressure resistance of 600 V. Further, an SBD (Reference Example 6) in which a GaN layer (having no composition change) was formed in place of the n-type compound semiconductor layer 43 was made. The thickness of the GaN layer was adjusted such that the pressure resistance of the SBD of Reference Example 6 becomes the same as that of the SBD of this Example. As a result, the pressure resistance of the SBD of this Example was approximately the same as that of the SBD of Reference Example 6 whereas the on-state resistance of the SBD of this Example was about ⅓ of that of the SBD of Reference Example 6.

Example 7

A semiconductor device 7 having the structure shown in FIG. 14 was produced in the same manner as in Example 1 except that an n-type AlGaN layer (composition change layer) 44 including a first semiconductor layer (n-type $Al_xGa_{1-x}N$ layer) 44A, a second semiconductor layer (n-type $Al_zGa_{1-z}N$ layer) 44B, and a third semiconductor layer (n-type $Al_wGa_{1-w}N$ layer) 44C was formed in place of the n-type $Al_xGa_{1-x}N$ layer (composition change layer) 23. With respect to the n-type AlGaN layer (composition change layer) 44, the overall thickness was 3.6 μm and the silicon doping concentration (donor impurity concentration) was $8.5 \times 10^{16} \, cm^{-3}$. The n-type compound semiconductor layer (composition change layer, n-type AlGaN layer) 44 was designed such that the Al composition ratio of the first semiconductor layer (lowest layer) 44A satisfied x=0.2, the Al composition ratio of the second semiconductor layer 44B satisfied z=0.1, and the Al composition ratio of the third semiconductor layer (uppermost layer) 44C satisfied w=0. In other words, the third semiconductor layer 44C is a GaN layer that does not include Al. Further, the first semiconductor layer 44A, the second semiconductor layer 44B, and the third semiconductor layer 44C were formed such that the thicknesses thereof were the same.

The semiconductor device 7 that was made according to this Example had the on-state resistance of $2.7 \times 10^{-5} \, \Omega cm^2$ relative to the pressure resistance of 600 V. Further, an SBD (Reference Example 7) in which a GaN layer (having no composition change) was formed in place of the n-type compound semiconductor layer 44 was made. The thickness of the GaN layer was adjusted such that the pressure resistance of the SBD of Reference Example 7 becomes the same as that of the SBD of this Example. As a result, the pressure resistance of the SBD of this Example was approximately the same as that of the SBD of Reference Example 7 whereas the on-state resistance of the SBD of this Example was about 60% of that of the SBD of Reference Example 7.

The invention of the present application was described above with reference to the Embodiments and Examples. However, the invention of the present application is not limited to the above-described Embodiments and Examples. Various changes that can be understood by those skilled in the an can be made in the configurations and details of the invention of the present application within the scope of the invention of the present application.

This application is the National Phase of PCT/JP2009/069988, filed Nov. 26, 2009, which claims priority from Japanese Patent Application No. 2008-335190 filed on Dec. 26, 2008. The entire subject matter of the Japanese Patent Applications is incorporated herein by reference.

EXPLANATION OF REFERENCE NUMERALS 1 to 9 and 11 Semiconductor device
10 and 34 Support substrate
12 and 39 Anode electrode
13 and 33 Cathode electrode
14 Insulation film
15 Trench portion
16 Depletion layer end
20 and 35 First buffer layer
21 and 36 Second buffer layer
22 and 37 $n^+$-type compound semiconductor layer
23 and 38 n-type compound semiconductor layer (composition change layer)
40 to 44 n-type compound semiconductor layer (composition change layer)
51 and 54 n-type compound semiconductor layer
52 and 53 n-type compound semiconductor layer (composition change layer)

The invention claimed is:
1. A semiconductor device comprising:
semiconductor layers;
an anode electrode; and
a cathode electrode, wherein
the semiconductor layers include a composition change layer,
the anode electrode is electrically connected to one of principal surfaces of the composition change layer through a formation of a Schottky junction between the anode electrode and a part of the semiconductor layers,
the cathode electrode is electrically connected to the other of the principal surfaces of the composition change layer through a formation of a junction between the cathode electrode and another part of the semiconductor layers,
the anode electrode and the cathode electrode are capable of applying a voltage to the composition change layer in a direction perpendicular to the principal surface, and
the composition change layer has composition that changes from a cathode electrode side toward an anode electrode side in the direction perpendicular to the principal surface of the composition change layer, has a negative polarization charge that is generated due to the composition that changes, and contains a donor impurity.
2. The semiconductor device according to claim 1, wherein the semiconductor layers are formed of a nitride semiconductor.

3. The semiconductor device according to claim 2, wherein the semiconductor layers are formed of a III-nitride semiconductor.

4. The semiconductor device according to claim 1, wherein the composition change layer has composition represented by $Al_xGa_{1-x}N$ ($0 \leq x < 1$), and a relationship between an Al composition ratio at the principal surface at the cathode electrode side $x_0$ ($x_0 > 0$) and an Al composition ratio at the principal surface at the anode electrode side $x_A$ ($x_A \geq 0$) satisfies the following equation: $x_0 > x_A$.

5. The semiconductor device according to claim 4, wherein an Al composition ratio x of the composition change layer decreases continuously from $x_0$ to $x_A$ from the cathode electrode side toward the anode electrode side in the direction perpendicular to the principal surface of the composition change layer.

6. The semiconductor device according to claim 4, wherein an Al composition ratio x of the composition change layer decreases in a stepwise manner from $x_0$ to $x_A$ from the cathode electrode side toward the anode electrode side in the direction perpendicular to the principal surface of the composition change layer.

7. The semiconductor device according to claim 5, wherein a decreasing gradient of the Al composition ratio of the composition change layer is a steep gradient from the cathode electrode side toward the anode electrode side.

8. The semiconductor device according to claim 7, wherein a volume density of a polarization charge that is generated in the composition change layer is uniform over the entire composition change layer.

9. The semiconductor device according to claim 5, wherein a volume density of a polarization charge that is generated in the composition change layer decreases from the cathode electrode side toward the anode electrode side in the direction perpendicular to the principal surface of the composition, change layer.

10. The semiconductor device according to claim 9, wherein a donor impurity concentration in the composition change layer decreases from the cathode electrode side toward the anode electrode side in the direction perpendicular to the principal surface of the composition change layer.

11. The semiconductor device according to claim 9, wherein a donor impurity concentration in the composition change layer is uniform over the entire composition change layer.

12. The semiconductor device according to claim 1, wherein a donor impurity concentration ($m^{-3}$) in the composition change layer is equal to a maximum value $N_{POL}^{MAX}$ ($m^{-3}$) of a volume density of a polarization charge that can be generated in the composition change layer.

13. The semiconductor device according to claim 1, wherein a donor impurity concentration ($m^{-3}$) in the composition change layer is not more than 5 times the maximum value $N_{POL}^{MAX}$ ($m^{-3}$) of a volume density of a polarization charge that can be generated in the composition change layer.

14. The semiconductor device according to claim 1, wherein a donor impurity concentration ($m^{-3}$) in the composition change layer is not more than 2.5 times the maximum value $N_{POL}^{MAX}$ ($m^{-3}$) of a volume density of a polarization charge that can be generated in the composition change layer.

15. The semiconductor device according to claim 1, wherein a junction plane between the cathode electrode and the semiconductor layer and the principal surface of the composition change layer at the cathode electrode side are arranged on the same level.

16. The semiconductor device according to claim 1, wherein the cathode electrode is formed at a top surface side of the semiconductor layer.

17. The semiconductor device according to claim 1, wherein the cathode electrode is formed at a bottom surface side of the semiconductor layer.

18. The semiconductor device according to claim 1, wherein the cathode electrode is in ohmic contact with the semiconductor layer.

19. The semiconductor device according to claim 1, further comprising:
an insulation film, wherein
an opening portion to be filled is formed at a part of a junction part of the semiconductor layer where it forms a junction with the anode electrode,
the insulation film is formed so as to cover the opening portion to be filled, and
the anode electrode forms a junction with the opening portion to be filled via the insulation film and forms a Schottky junction with a part of the junction part excluding the opening portion to be filled.

20. The semiconductor device according to claim 19, wherein a bottom surface of the composition change layer is arranged on the same level as or on a higher level than a lower end of the opening portion to be filled.

21. The semiconductor device according to claim 19, wherein a top surface of the composition change layer is arranged on a lower level than an upper end of the opening portion to be filled.

22. The semiconductor device according to claim 21, wherein the top surface of the composition change layer is arranged on the same level as or on a lower level than a lower end of the opening portion to be filled.

23. The semiconductor device according to claim 1, wherein the semiconductor device is a Schottky barrier diode.

24. An electronic apparatus comprising the semiconductor device according to claim 1.

25. A method of producing the semiconductor device according to claim 1 comprising:
a semiconductor layer formation step of forming the semiconductor layers; and
an electrode junction step of forming a Schottky junction between the anode electrode and a part of the semiconductor layers and of forming a junction between the cathode electrode and another part of the semiconductor layers, wherein the semiconductor layer formation step comprises a composition change layer formation step,
in the composition change layer formation step, the composition change layer is formed such that it generates a negative polarization charge due to its composition that changes in the direction perpendicular to the principal surface and it contains a donor impurity, and
in the electrode junction step, the anode electrode and the cathode electrode are formed so as to be capable of applying a voltage to the composition change layer in the direction perpendicular to the principal surface.

26. A method of producing the semiconductor device according to claim 5 comprising:
a semiconductor layer formation step of forming the semiconductor layers; and
an electrode junction step of forming a Schottky junction between the anode electrode and a part of the semiconductor layers and of forming a junction between the cathode electrode and another part of the semiconductor layers, wherein the semiconductor layer formation step comprises a composition change layer formation step, in the composition change layer formation step, the composition change layer is formed such that it generates a negative polarization charge due to its composition that changes in the direction perpendicular to the principal surface and it contains a donor impurity, and in the electrode junction step, the anode electrode and the cathode electrode are formed so as to be capable of applying a voltage to the composition change layer in the direction perpendicular to the principal surface, and wherein in the composition change layer formation step, the composition change layer is formed such that the Al composition ratio x of the composition change layer decreases continuously from $x_0$ to $x_A$ from the cathode electrode side toward the anode electrode side in the direction perpendicular to the principal surface of the composition change layer.

27. A method of producing the semiconductor device according to claim 6 comprising:
   a semiconductor layer formation step of forming the semiconductor layers; and
   an electrode junction step of forming a Schottky junction between the anode electrode and a part of the semiconductor layers and of forming a junction between the cathode electrode and another part of the semiconductor layers, wherein the semiconductor layer formation step comprises a composition change layer formation step,
in the composition change layer formation step, the composition change layer is formed such that it generates a negative polarization charge due to its composition that changes in the direction perpendicular to the principal surface and it contains a donor impurity, and
in the electrode junction step, the anode electrode and the cathode electrode are formed so as to be capable of applying a voltage to the composition change layer in the direction perpendicular to the principal surface, and wherein
in the composition change layer formation step, the composition change layer is formed such that the Al composition ratio x of the composition change layer decreases in a stepwise manner from $x_0$ to $x_A$ from the cathode electrode side toward the anode electrode side in the direction perpendicular to the principal surface of the composition change layer.

28. A method of producing the semiconductor device according to claim 7 comprising:
   a semiconductor layer formation step of forming the semiconductor layers; and
   an electrode junction step of forming a Schottky junction between the anode electrode and a part of the semiconductor layers and of forming a junction between the cathode electrode and another part of the semiconductor layers, wherein the semiconductor layer formation step comprises a composition change layer formation step,
in the composition change layer formation step, the composition change layer is formed such that it generates a negative polarization charge due to its composition that changes in the direction perpendicular to the principal surface and it contains a donor impurity, and
in the electrode junction step, the anode electrode and the cathode electrode are formed so as to be capable of applying a voltage to the composition change layer in the direction perpendicular to the principal surface, and wherein
in the composition change layer formation step, the composition change layer is formed such that the Al composition ratio x of the composition change layer decreases continuously from $x_0$ to $x_A$ from the cathode electrode side toward the anode electrode side in the direction perpendicular to the principal surface of the composition change layer, and the decreasing gradient of the Al composition ratio of the composition change layer is a steep gradient from the cathode electrode side toward the anode electrode side.

29. A method of producing the semiconductor device according to claim 8 comprising:
   a semiconductor layer formation step of forming the semiconductor layers; and
   an electrode junction step of forming a Schottky junction between the anode electrode and a part of the semiconductor layers and of forming a junction between the cathode electrode and another part of the semiconductor layers, wherein the semiconductor layer formation step comprises a composition change layer formation step,
in the composition change layer formation step, the composition change layer is formed such that it generates a negative polarization charge due to its composition that changes in the direction perpendicular to the principal surface and it contains a donor impurity, and
in the electrode junction step, the anode electrode and the cathode electrode are formed so as to be capable of applying a voltage to the composition change layer in the direction perpendicular to the principal surface, and wherein
in the composition change layer formation step, the composition change layer is formed such that the Al composition ratio x of the composition change layer decreases continuously from $x_0$ to $x_A$ from the cathode electrode side toward the anode electrode side in the direction perpendicular to the principal surface of the composition change layer, the decreasing gradient of the Al composition ratio of the composition change layer is a steep gradient from the cathode electrode side toward the anode electrode side, and a volume density of a polarization charge that is generated in the composition change layer is uniform over the entire composition change layer.

30. A method of producing the semiconductor device according to claim 19 comprising:
   a semiconductor layer formation step of forming the semiconductor layers; and
   an electrode junction step of forming a Schottky junction between the anode electrode and a part of the semiconductor layers and of forming a junction between the cathode electrode and another part of the semiconductor layers,
   an opening portion to be filled formation step of forming the opening portion to be filled on a part of the semiconductor layer; and
   an insulation film formation step of forming the insulation film so as to cover the opening portion to be filled, wherein
the semiconductor layer formation step comprises a composition change layer formation step,
   in the composition change layer formation step, the composition change layer is formed such that it generates a negative polarization charge due to its composition that changes in the direction perpendicular to the principal surface and it contains a donor impurity, and
in the electrode junction step, the anode electrode and the cathode electrode are formed so as to be capable of applying a voltage to the composition change layer in the direction perpendicular to the principal surface, and wherein
in the electrode junction step, the anode electrode forms a junction with the opening portion to be filled via the insulation film and forms a Schottky junction with a part of the junction part excluding the opening portion to be filled.

31. The semiconductor device according to claim 1, wherein the composition change layer has composition represented by $Al_xGa_{1-x}N$ ($0 \leq x < 1$), and a relationship between an Al composition ratio at the principal surface at the cathode electrode side $x_0$ ($x_0>0$) and an Al composition ratio at the principal surface at the anode electrode side $x_A$ ($x_A \geq 0$) satisfies the following equation: $x_0>x_A$;

wherein an Al composition ratio x of the composition change layer decreases in a stepwise manner from $x_0$ to $x_A$ from the cathode electrode side toward the anode electrode side in the direction perpendicular to the principal surface of the composition change layer; and wherein a decreasing gradient of the Al composition ratio of the composition change layer is a steep gradient from the cathode electrode side toward the anode electrode side.

32. The semiconductor device according to claim 1, wherein the composition change layer has composition represented by $Al_xGa_{1-x}N$ ($0 \leq x<1$), and a relationship between an Al composition ratio at the principal surface at the cathode electrode side $x_0$ ($x_0>0$) and an Al composition ratio at the principal surface at the anode electrode side $x_A$ ($x_A \geq 0$) satisfies the following equation: $x_0>x_A$;

wherein an Al composition ratio x of the composition change layer decreases in a stepwise manner from $x_0$ to $x_A$ from the cathode electrode side toward the anode electrode side in the direction perpendicular to the principal surface of the composition change layer;

wherein a volume density of a polarization charge that is generated in the composition change layer decreases from the cathode electrode side toward the anode electrode side in the direction perpendicular to the principal surface of the composition, change layer;

wherein a decreasing gradient of the Al composition ratio of the composition change layer is a steep gradient from the cathode electrode side toward the anode electrode side; and wherein a volume density of a polarization charge that is generated in the composition change layer is uniform over the entire composition change layer.

33. The semiconductor device according to claim 1, wherein the composition change layer has composition represented by $Al_xGa_{1-x}N$ ($0 \leq x<1$), and a relationship between an Al composition ratio at the principal surface at the cathode electrode side $x_0$ ($x_0>0$) and an Al composition ratio at the principal surface at the anode electrode side $x_A$ ($x_A \geq 0$) satisfies the following equation: $x_0>x_A$;

wherein an Al composition ratio x of the composition change layer decreases in a stepwise manner from $x_0$ to $x_A$ from the cathode electrode side toward the anode electrode side in the direction perpendicular to the principal surface of the composition change layer;

wherein a volume density of a polarization charge that is generated in the composition change layer decreases from the cathode electrode side toward the anode electrode side in the direction perpendicular to the principal surface of the composition, change layer; and wherein a donor impurity concentration in the composition change layer decreases from the cathode electrode side toward the anode electrode side in the direction perpendicular to the principal surface of the composition change layer.

34. A method of producing a semiconductor device comprising semiconductor layers, an anode electrode, and a cathode electrode, wherein the semiconductor layers include a composition change layer, the anode electrode is electrically connected to one of principal surfaces of the composition change layer through a formation of a Schottky junction between the anode electrode and a part of the semiconductor layers, the cathode electrode is electrically connected to the other of the principal surfaces of the composition change layer through a formation of a junction between the cathode electrode and another part of the semiconductor layers, the anode electrode and the cathode electrode are capable of applying a voltage to the composition change layer in a direction perpendicular to the principal surface, the composition change layer has composition that changes from a cathode electrode side toward an anode electrode side in the direction perpendicular to the principal surface of the composition change layer, has a negative polarization charge that is generated due to the composition that changes, and contains a donor impurity;

the method comprising:

a semiconductor layer formation step of forming the semiconductor layers; and an electrode junction step of forming a Schottky junction between the anode electrode and a part of the semiconductor layers and of forming a junction between the cathode electrode and another part of the semiconductor layers, wherein the semiconductor layer formation step comprises a composition change layer formation step, in the composition change layer formation step, the composition change layer is formed such that it generates a negative polarization charge due to its composition that changes in the direction perpendicular to the principal surface and it contains a donor impurity, and in the electrode junction step, the anode electrode and the cathode electrode are formed so as to be capable of applying a voltage to the composition change layer in the direction perpendicular to the principal surface; and wherein in the composition change layer formation step, the composition change layer is formed such that the Al composition ratio x of the composition change layer decreases continuously from $x_0$ to $x_A$ from the cathode electrode side toward the anode electrode side in the direction perpendicular to the principal surface of the composition change layer; and wherein in the composition change layer formation step, the composition change layer is formed such that the Al composition ratio x of the composition change layer decreases continuously from $x_0$ to $x_A$ from the cathode electrode side toward the anode electrode side in the direction perpendicular to the principal surface of the composition change layer, and the decreasing gradient of the Al composition ratio of the composition change layer is a steep gradient from the cathode electrode side toward the anode electrode side.

35. A method of producing a semiconductor device according to claim 34, wherein a volume density of a polarization charge that is generated in the composition change layer is uniform over the entire composition change layer.

* * * * *